United States Patent
Oh et al.

(10) Patent No.: US 12,512,427 B2
(45) Date of Patent: Dec. 30, 2025

(54) SEMICONDUCTOR DEVICE INCLUDING LOWER PADS HAVING DIFFERENT WIDTHS AND SEMICONDUCTOR PACKAGE INCLUDING THE SAME

(71) Applicant: Samsung Electronics Co., Ltd., Suwon-si (KR)

(72) Inventors: Jun Young Oh, Seoul (KR); Un-Byoung Kang, Hwaseong-Si (KR); Byeongchan Kim, Anyang-si (KR); Jumyong Park, Cheonan-si (KR); Chungsun Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 603 days.

(21) Appl. No.: 17/870,898

(22) Filed: Jul. 22, 2022

(65) Prior Publication Data
US 2023/0132272 A1  Apr. 27, 2023

(30) Foreign Application Priority Data
Oct. 22, 2021 (KR) .................. 10-2021-0142112

(51) Int. Cl.
*H01L 23/00* (2006.01)
*H01L 25/065* (2023.01)

(52) U.S. Cl.
CPC .............. *H01L 24/08* (2013.01); *H01L 24/05* (2013.01); *H01L 24/06* (2013.01); *H01L 24/09* (2013.01);
(Continued)

(58) Field of Classification Search
CPC ......... H01L 24/08; H01L 24/05; H01L 24/06; H01L 24/09; H01L 24/80; H01L 24/16;
(Continued)

(56) References Cited

U.S. PATENT DOCUMENTS

| 7,485,959 B2 | 2/2009 | Yoo et al. |
| 8,446,016 B2 | 5/2013 | Kang et al. |
| (Continued) | | |

FOREIGN PATENT DOCUMENTS

| JP | 2011210789 A | 10/2011 |
| JP | 4842864 B2 | 12/2011 |
| (Continued) | | |

OTHER PUBLICATIONS

B. A. Nina et al., "The Design of Simple Bacterial Microarrays: Development towards Immobilizing Single Living Bacteria on Predefined Micro-Sized Spots on Patterned Surfaces," PLOS ONE, Oct. 6, 2015 (15 pages).

(Continued)

*Primary Examiner* — Duy T Nguyen
*Assistant Examiner* — Jiyoung Oh
(74) *Attorney, Agent, or Firm* — Muir Patent Law, PLLC

(57) ABSTRACT

The semiconductor device may include a substrate, a first insulating layer on a bottom surface of the substrate, an interconnection structure in the first insulating layer, a second insulating layer on a bottom surface of the first insulating layer, and a plurality of lower pads provided in the second insulating layer. Each lower pad may be provided such that a width of a top surface thereof is smaller than a width of a bottom surface thereof. The lower pads may include first, second, and third lower pads. In a plan view, the first and third lower pads may be adjacent to center and edge portions of the substrate, respectively, and the second lower pad may be disposed therebetween. A width of a bottom surface of the second lower pad may be smaller than that of the first lower pad and may be larger than that of the third lower pad.

19 Claims, 17 Drawing Sheets

(52) U.S. Cl.
CPC .......... *H01L 24/80* (2013.01); *H01L 25/0652* (2013.01); *H01L 25/0657* (2013.01); *H01L 24/16* (2013.01); *H01L 24/32* (2013.01); *H01L 24/73* (2013.01); *H01L 2224/05009* (2013.01); *H01L 2224/05082* (2013.01); *H01L 2224/05541* (2013.01); *H01L 2224/0603* (2013.01); *H01L 2224/0801* (2013.01); *H01L 2224/08056* (2013.01); *H01L 2224/08057* (2013.01); *H01L 2224/08145* (2013.01); *H01L 2224/0903* (2013.01); *H01L 2224/0913* (2013.01); *H01L 2224/09152* (2013.01); *H01L 2224/16227* (2013.01); *H01L 2224/32225* (2013.01); *H01L 2224/73204* (2013.01); *H01L 2224/80895* (2013.01); *H01L 2224/80896* (2013.01); *H01L 2225/06517* (2013.01); *H01L 2225/06524* (2013.01); *H01L 2225/06527* (2013.01); *H01L 2225/06541* (2013.01); *H01L 2924/1431* (2013.01); *H01L 2924/1432* (2013.01); *H01L 2924/1433* (2013.01); *H01L 2924/1436* (2013.01)

(58) Field of Classification Search
CPC ......... H01L 24/32; H01L 24/73; H01L 24/17; H01L 24/25; H01L 24/13; H01L 25/0652; H01L 25/0657; H01L 25/18; H01L 2224/05009; H01L 2224/05082; H01L 2224/05541; H01L 2224/0603; H01L 2224/0801; H01L 2224/08056; H01L 2224/08057; H01L 2224/08145; H01L 2224/0903; H01L 2224/09152; H01L 2224/16227; H01L 2224/32225; H01L 2224/73204; H01L 2224/80895; H01L 2224/80896; H01L 2224/09055; H01L 2225/06517; H01L 2225/06524; H01L 2225/06527; H01L 2225/06541; H01L 2225/06565; H01L 2225/06513; H01L 2924/1431; H01L 2924/1432; H01L 2924/1433; H01L 2924/1436; H01L 23/481
USPC ........................................................ 257/295
See application file for complete search history.

(56) References Cited

U.S. PATENT DOCUMENTS

| | | | |
|---|---|---|---|
| 8,816,491 | B2 | 8/2014 | Chen et al. |
| 9,530,744 | B2 | 12/2016 | Oi et al. |
| 9,640,243 | B2 | 5/2017 | Shibata et al. |
| 9,935,085 | B2 | 4/2018 | Kirby et al. |
| 2011/0233771 | A1* | 9/2011 | Kwon ............... H01L 23/49816 257/737 |
| 2013/0052817 | A1 | 2/2013 | Hsiao |
| 2017/0110388 | A1* | 4/2017 | Park ....................... H01L 23/13 |
| 2018/0040549 | A1* | 2/2018 | Shim ....................... H01L 24/14 |
| 2019/0287930 | A1* | 9/2019 | Tsuchida .................. H05K 1/16 |
| 2020/0006324 | A1* | 1/2020 | Chen ...................... H01L 24/09 |
| 2020/0098711 | A1 | 3/2020 | Choi et al. |

FOREIGN PATENT DOCUMENTS

| | | |
|---|---|---|
| JP | 2014179362 A | 9/2014 |
| KR | 1020060083284 A | 7/2006 |
| KR | 1020200034078 A | 3/2020 |

OTHER PUBLICATIONS

Baiwa et. al., "KOH etching of (100) Si wafer, No. 1," Protocols and Reports. Paper 18 Univ. Penn. (https://repository.upenn.edu/scn_protocols/18) (8 pages).

Myeongwoo Kang et. al., "Fabrication of functional 3D multi-level microstructures on transparent substrates by one step back-side," UV photolithography, Royal Society of Chemistry, RSC Adv., 2017, 7, 13353 (9 pages).

* cited by examiner

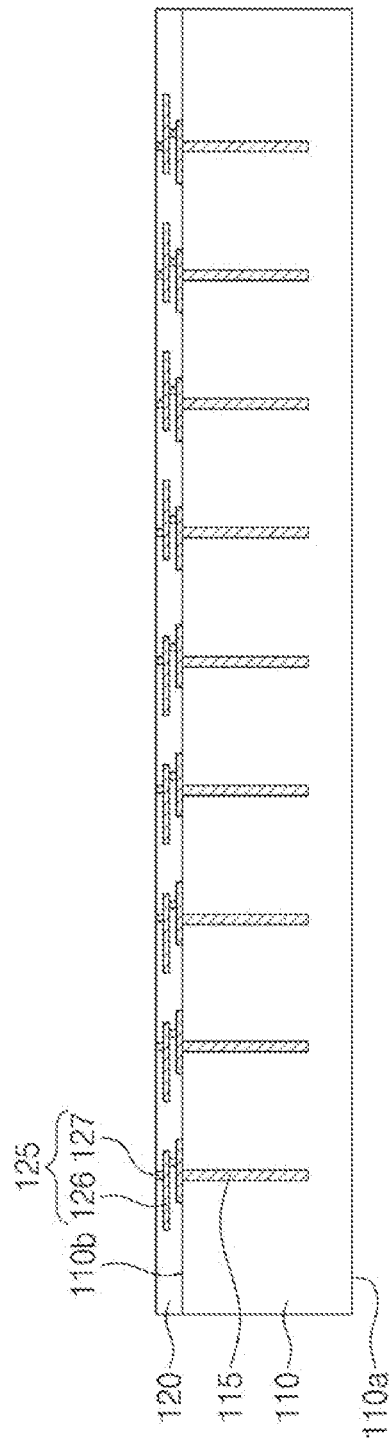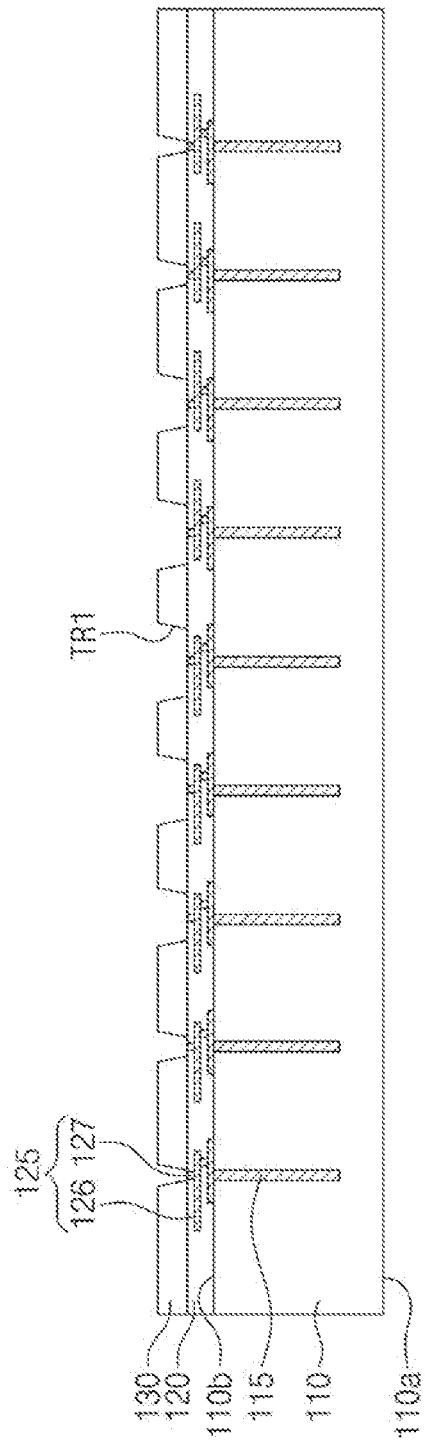

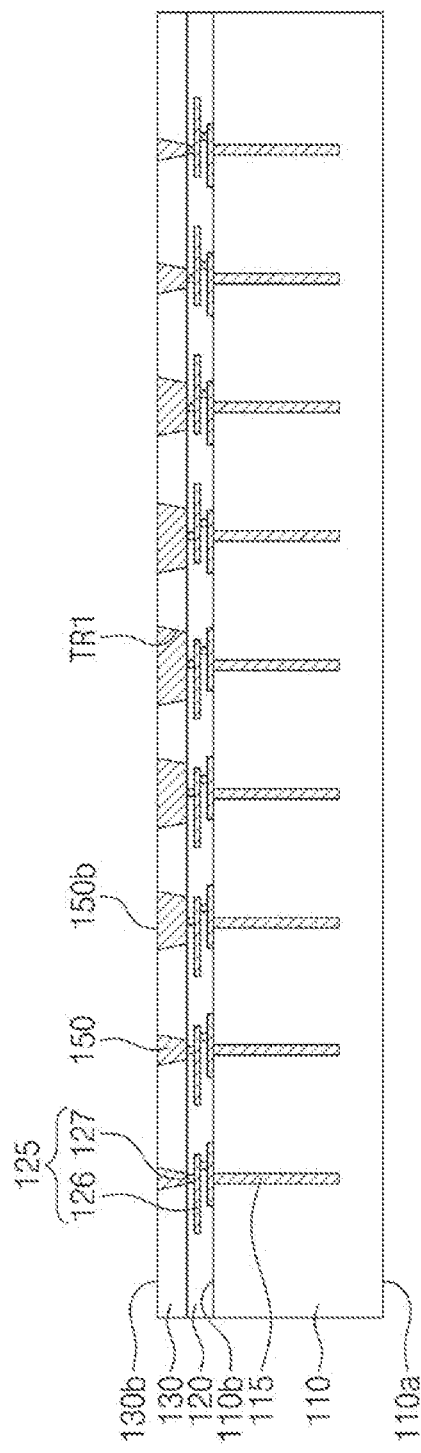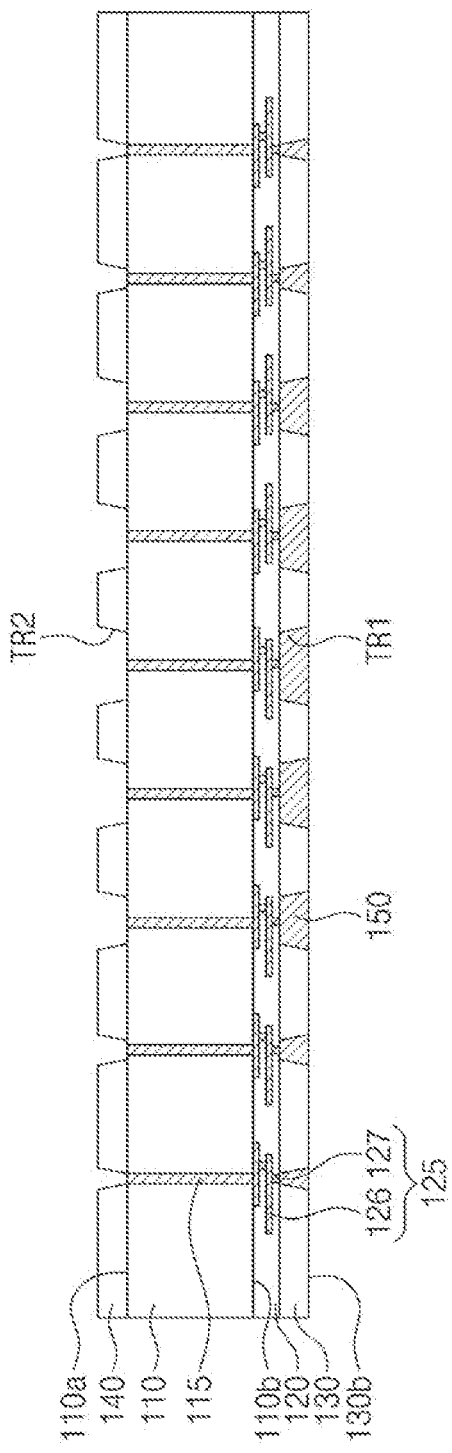

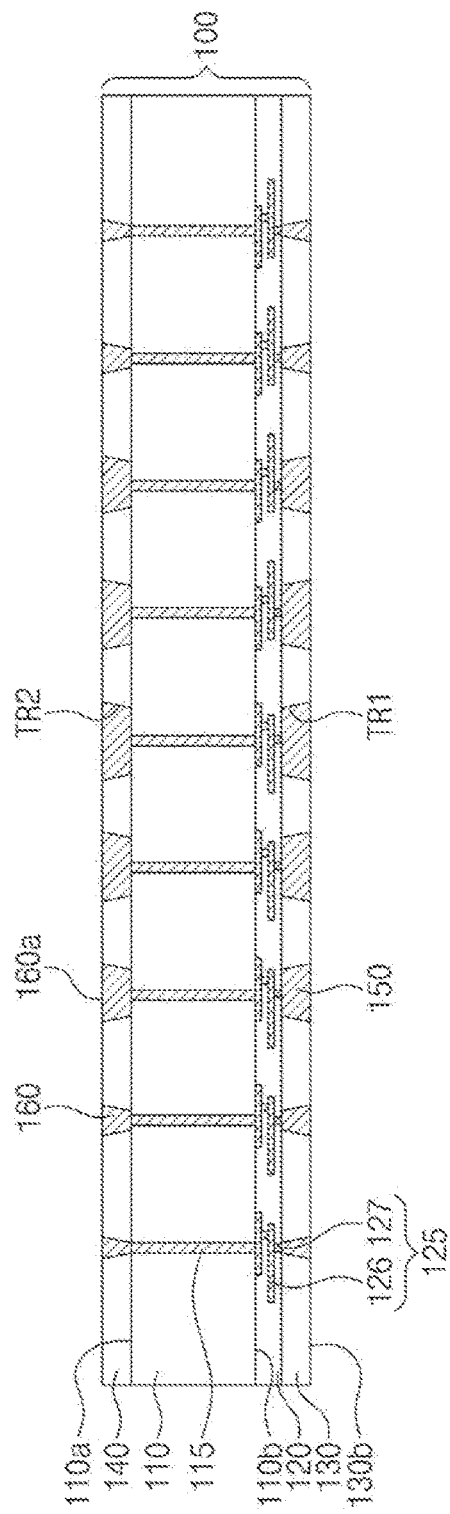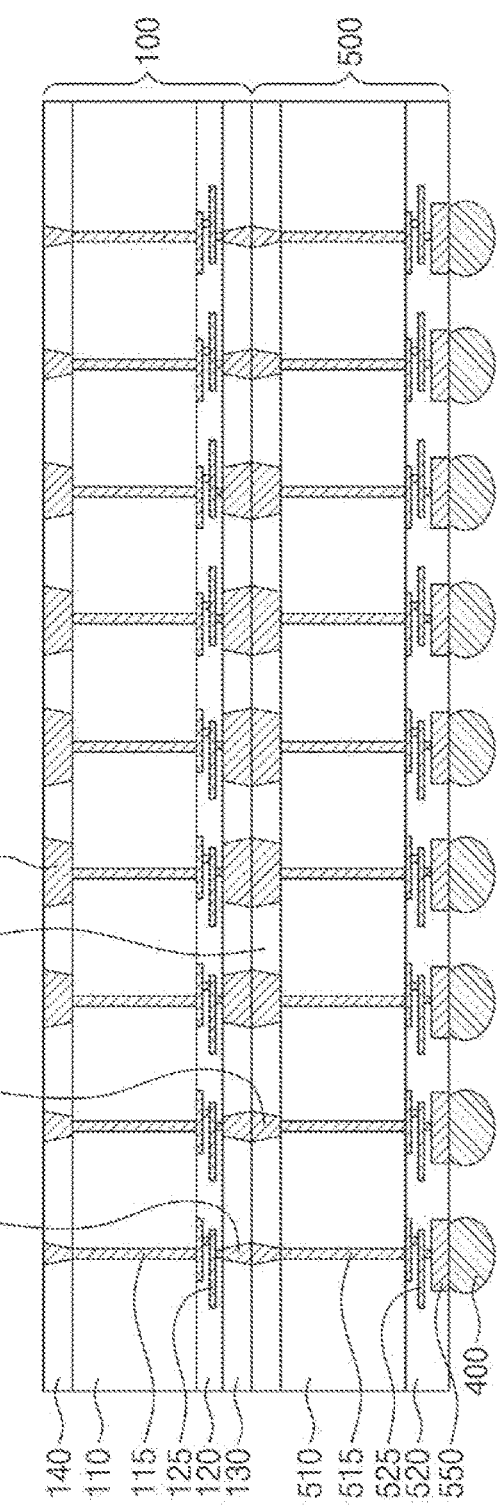

SEMICONDUCTOR DEVICE INCLUDING LOWER PADS HAVING DIFFERENT WIDTHS AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2021-0142112, filed on Oct. 22, 2021, in the Korean Intellectual Property Office, the entire contents of which are hereby incorporated by reference.

BACKGROUND OF THE INVENTION

The present disclosure relates to a semiconductor device and a semiconductor package including the same, and in particular, to a semiconductor device with improved reliability and a semiconductor package including the same.

With the recent advance in the electronics industry, demand for high-performance, high-speed, and compact electronic components are increasing. To meet this demand, packaging technologies of mounting a plurality of semiconductor chips in a single package are being developed.

Recently, demand for portable electronic devices has been rapidly increasing in the market, and thus, it is necessary to reduce sizes and weights of electronic components constituting the portable electronic devices. For this, it is necessary to develop packaging technologies of reducing a size and a weight of each component and of integrating a plurality of individual components in a single package. In particular, for a semiconductor package used to process high frequency signals, it is necessary not only to reduce a size of a product but also to realize good electrical characteristics.

SUMMARY

An embodiment of the inventive concept provides a semiconductor device with improved reliability.

An embodiment of the inventive concept provides a semiconductor package including a semiconductor device with improved reliability.

According to an embodiment of the inventive concept, a semiconductor device may include a substrate, a first insulating layer on a bottom surface of the substrate, an interconnection structure provided in the first insulating layer, a second insulating layer on a bottom surface of the first insulating layer, and a plurality of lower pads provided in the second insulating layer. Each of the lower pads may be provided such that a width of a top surface thereof is smaller than a width of a bottom surface thereof. The lower pads may include a first lower pad, a second lower pad, and a third lower pad. When viewed in a plan view, the first lower pad may be adjacent to a center of the substrate, the third lower pad may be adjacent to an edge of the substrate, and the second lower pad may be disposed between the first lower pad and the third lower pad. A width of a bottom surface of the first lower pad may be larger than a width of a bottom surface of the second lower pad, and the width of the bottom surface of the second lower pad may be larger than a width of a bottom surface of the third lower pad.

According to an embodiment of the inventive concept, a semiconductor package may include a first semiconductor chip and a second semiconductor chip on a bottom surface of the first semiconductor chip. The first semiconductor chip may include a substrate, a first insulating layer on a bottom surface of the substrate, an interconnection structure provided in the first insulating layer, a second insulating layer on a bottom surface of the first insulating layer, and a plurality of lower pads provided in the second insulating layer. A width of each of the plurality of lower pads may increase as a distance to a bottom surface thereof decreases, and the plurality of lower pads may include a first lower pad adjacent to a center of the substrate and a second lower pad adjacent to an edge of the substrate. A width of a top surface of the first lower pad may be larger than a width of a top surface of the second lower pad.

According to an embodiment of the inventive concept, a semiconductor package may include a package substrate, a first lower semiconductor chip on the package substrate, and a first upper semiconductor chip on the first lower semiconductor chip. Each of the first lower and upper semiconductor chips may include a substrate, a first insulating layer on a bottom surface of the substrate, an interconnection structure provided in the first insulating layer, a second insulating layer on a bottom surface of the first insulating layer, and a plurality of lower patterns provided in the second insulating layer. The first lower semiconductor chip may further include a third insulating layer on a top surface of the substrate and a plurality of upper patterns provided in the third insulating layer. The plurality of upper patterns of the first lower semiconductor chip may be in contact with the plurality of lower patterns of the first upper semiconductor chip, and as a distance to a center of the substrate decreases, widths of top surfaces of the plurality of lower patterns may gradually increase, when viewed in a plan view.

According to an embodiment of the inventive concept, a semiconductor package may include a first lower semiconductor chip and a first upper semiconductor chip on the first lower semiconductor chip. Each of the first lower and upper semiconductor chips may include a substrate, a first insulating layer on a bottom surface of the substrate, and interconnection structures provided in the first insulating layer. The first lower semiconductor chip may further include penetration vias penetrating the substrate. The penetration vias may include a first via, a second via, and a third via. The first via may be adjacent to a center of the substrate, the third via may be adjacent to an edge of the substrate, and the second via may be disposed between the first via and the third via, when viewed in a plan view. A width of the first via may be larger than a width of the second via, and the width of the second via may be larger than a width of the third via.

BRIEF DESCRIPTION OF THE DRAWINGS

FIGS. 17, 18, 19, 20, 21, and 22 are sectional views illustrating a method of fabricating a semiconductor package including a semiconductor device, according to an example embodiment of the inventive concept.

DETAILED DESCRIPTION

Figure 1:
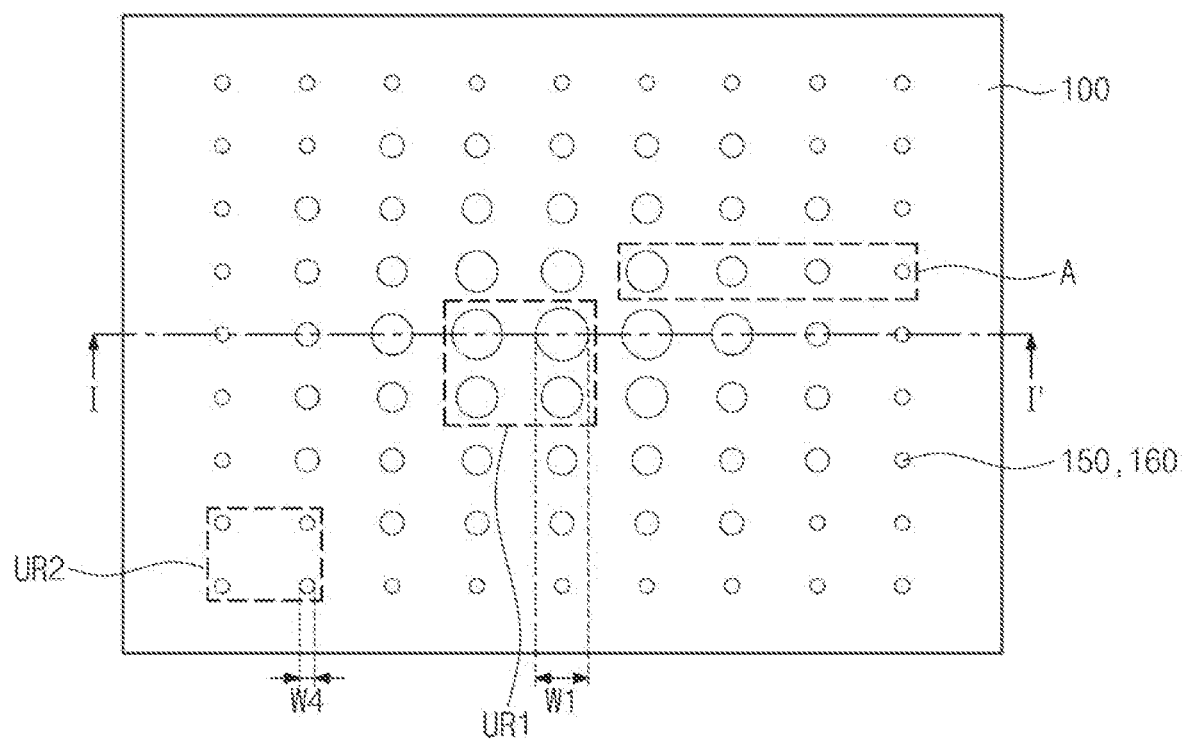
FIG. 1 is a plan view illustrating a semiconductor package including a semiconductor device, according to an example embodiment of the inventive concept.

Example embodiments of the inventive concepts will now be described more fully with reference to the accompanying drawings, in which example embodiments are shown. Like reference numerals refer to like elements throughout.

Figure 2A:
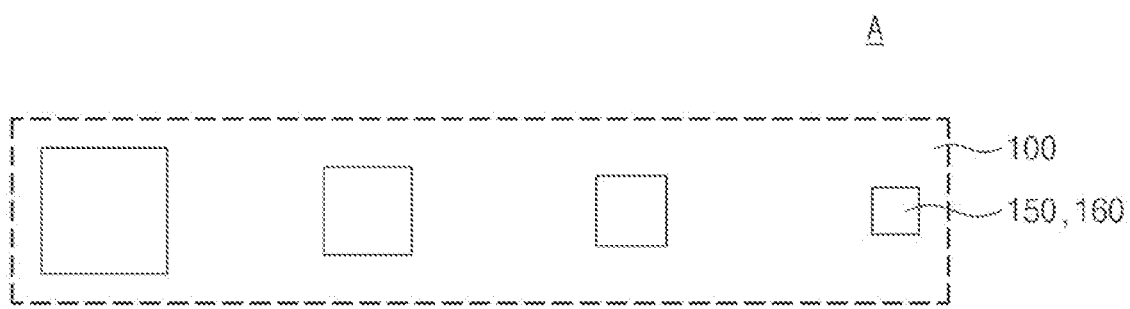
FIG. 2A is an enlarged plan view illustrating a portion (e.g., A of FIG. 1) of a semiconductor device, according to an example embodiment of the inventive concept.
Figure 2B:
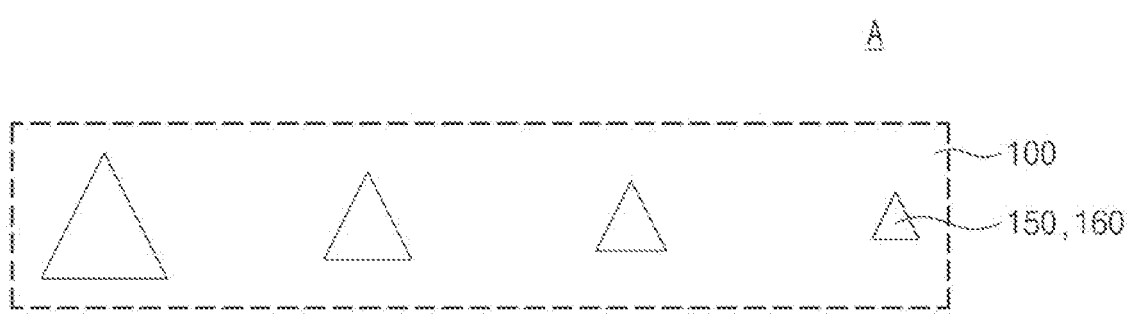
FIG. 2B is an enlarged plan view illustrating a portion (e.g., A of FIG. 1) of a semiconductor device, according to an example embodiment of the inventive concept.
Figure 3:
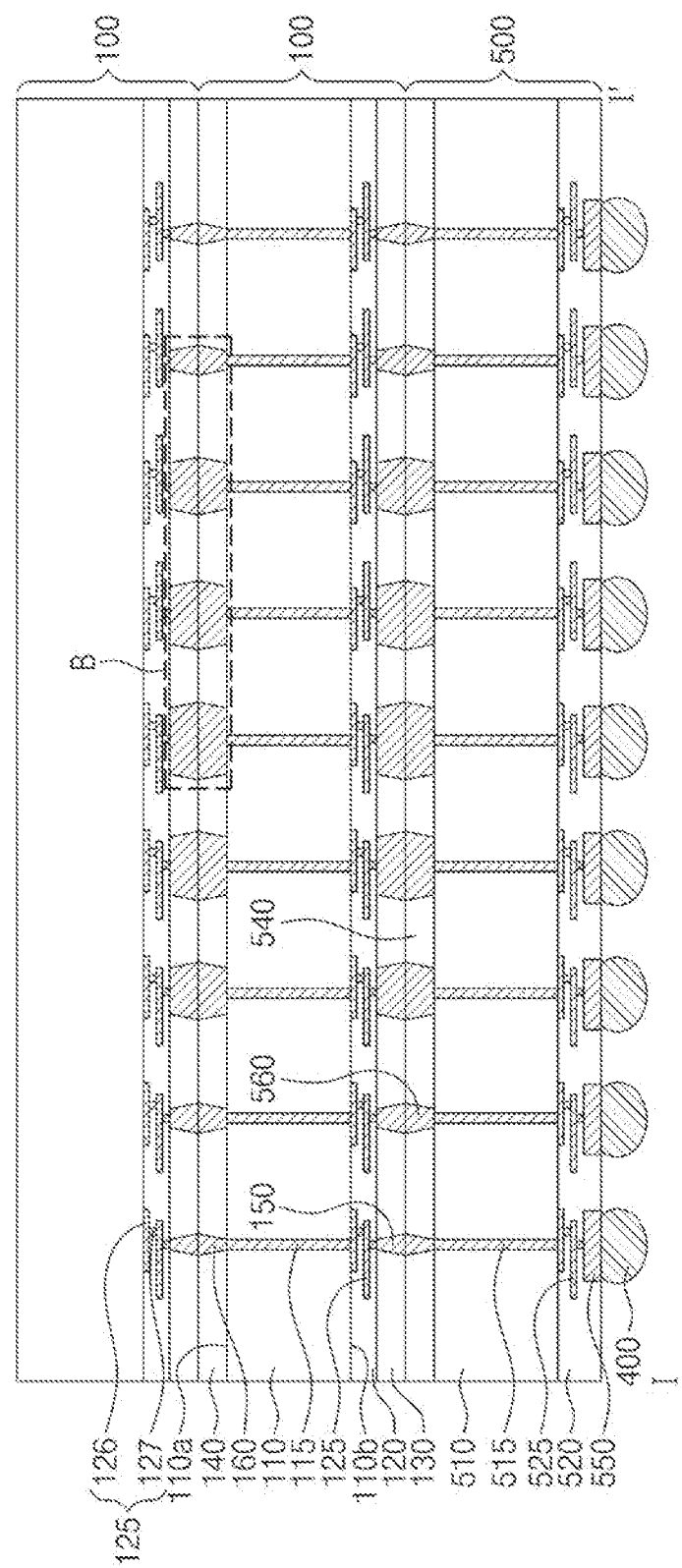
FIG. 3 is a sectional view taken along a line I-I' of FIG. 1 to illustrate a semiconductor package including a semiconductor device, according to an example embodiment of the inventive concept.
Figure 4:
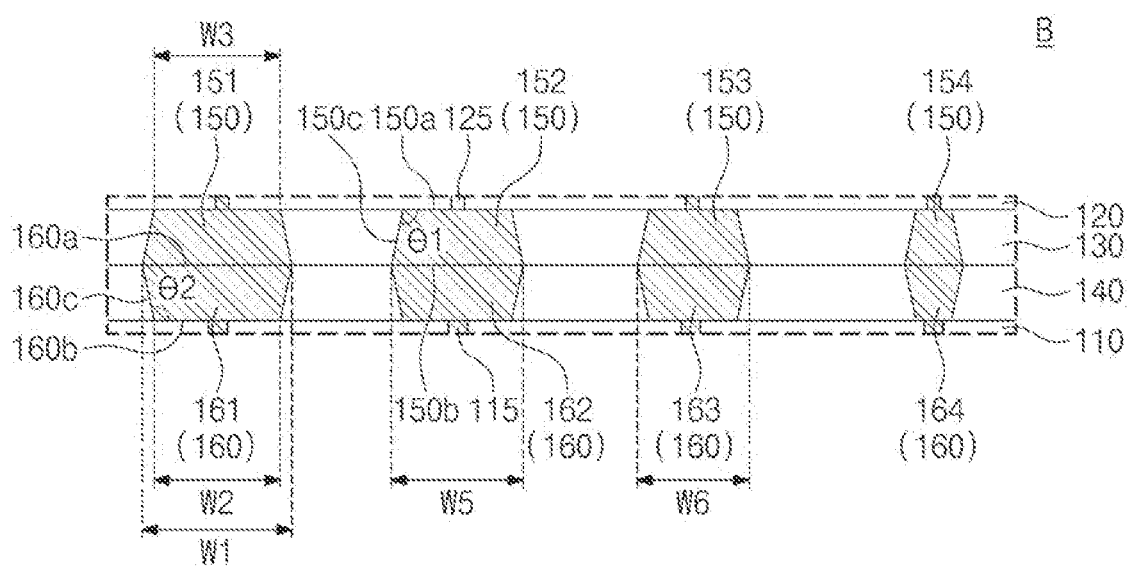
FIG. 4 is an enlarged sectional view illustrating a portion B of FIG. 3.

FIG. 1 is a plan view illustrating a semiconductor package including a semiconductor device, according to an example embodiment of the inventive concept. FIG. 2A is an enlarged plan view illustrating a portion (e.g., A of FIG. 1) of a semiconductor device, according to an example embodiment of the inventive concept. FIG. 2B is an enlarged plan view illustrating a portion (e.g., A of FIG. 1) of a semiconductor device, according to an example embodiment of the inventive concept. FIG. 3 is a sectional view taken along a line I-I' of FIG. 1 to illustrate a semiconductor package including a semiconductor device, according to an example embodiment of the inventive concept. FIG. 4 is an enlarged sectional view illustrating a portion B of FIG. 3.

Referring to FIGS. 1, 2A, 2B, 3, and 4, a semiconductor package may include a plurality of first semiconductor chips 100, which are stacked, and a second semiconductor chip 500.

The first semiconductor chips 100 may be provided on the second semiconductor chip 500. Each of the first semiconductor chips 100 may include a substrate 110, a first insulating layer 120, and a second insulating layer 130. For example, the first semiconductor chip 100 may be one of memory chips, logic chips, or combinations thereof. In the present specification, a semiconductor device may mean the first semiconductor chip 100. The substrate 110 may be formed of or may include at least one of semiconductor materials (e.g., silicon, germanium, or silicon germanium).

A penetration via 115 may be provided in the substrate 110. The penetration via 115 may be provided to penetrate the substrate 110. For example, a top surface of the penetration via 115 may be coplanar with a top surface 110a of the substrates 110 and a bottom surface of the penetration via 115 may be coplanar with a bottom surface 110b of the substrate 110. In an embodiment, a plurality of the penetration vias 115 may be provided. The penetration via 115 may include a conductive metal material. For example, the penetration via 115 may be formed of or may include at least one of copper (Cu), aluminum (Al), tungsten (W), or titanium (Ti). Although not shown, an insulating layer and/or a barrier layer may be further interposed between the penetration via 115 and the substrate 110.

The first insulating layer 120 may be disposed on a bottom surface 110b of the substrate 110. In some embodiments, an upper surface of the first insulating layer 120 may contact the bottom surface 110b of the substrate 110. The first insulating layer 120 may include an insulating material. For example, the first insulating layer 120 may be formed of or may include at least one of silicon oxide, silicon nitride, or silicon oxynitride. The first insulating layer 120 may be composed of a single layer or may include a plurality of stacked layers. Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "contact," as used herein, refers to a direct connection (i.e., touching) unless the context indicates otherwise.

An interconnection structure 125 may be provided in the first insulating layer 120. In an embodiment, a plurality of the interconnection structures 125 may be provided. For example, a plurality of interconnection structures 125 may be provided in each of the first insulating layers 120. Each of the interconnection structures 125 may include conductive patterns 126 and conductive vias 127. The conductive vias 127 may be provided to penetrate a portion of the first insulating layer 120 and may be electrically connected to the conductive patterns 126. The conductive patterns 126 and the conductive vias 127 may include a conductive metal material. For example, the conductive patterns 126 and the conductive vias 127 may be formed of or may include at least one of copper (Cu), aluminum (Al), tungsten (W), or titanium (Ti). The first insulating layer 120 may cover the conductive patterns 126 and the conductive vias 127. The interconnection structure 125 may be electrically connected to the penetration via 115. In the present specification, the expression "two elements are electrically connected/coupled to each other" may mean that the elements are directly connected/coupled to each other or are indirectly connected/coupled to each other through another conductive element.

The second insulating layer 130 may be disposed on a bottom surface of the first insulating layer 120. In some embodiments, a top surface of the second insulating layer 130 may contact the bottom surface of the first insulating layer 120. The second insulating layer 130 may include an insulating material. For example, the second insulating layer 130 may be formed of or may include at least one of silicon oxide, silicon nitride, or silicon oxynitride. The second insulating layer 130 may be composed of a single layer or may include a plurality of stacked layers. In an embodiment, the second insulating layer 130 may be formed of or may include a material different from the first insulating layer 120. In this case, there may be an observable interface between the first insulating layer 120 and the second insulating layer 130. In another embodiment, the second insulating layer 130 may be formed of or may include the same material as the first insulating layer 120. In this case, there may be no observable interface between the first insulating layer 120 and the second insulating layer 130. However, the inventive concept is not limited to this example, and in an embodiment, there may be an observable interface between the first insulating layer 120 and the second insulating layer 130.

A plurality of lower pads 150 may be provided in the second insulating layer 130. In example embodiments, top surfaces of the lower pads 150 may be at the same level as a top surface of the second insulating layer 130, and bottom surfaces of the lower pads 150 may be at the same level as a bottom surface of the second insulating layer 130. The lower pads 150 may be electrically connected to the interconnection structures 125. Each of the lower pads 150 may be electrically connected to a corresponding one of the conductive vias 127. In some embodiments, each of the lower pads 150 may be in contact with a corresponding one of the conductive vias 127. The lower pads 150 may include a conductive metal material. For example, the lower pads 150 may be formed of or may include at least one of copper (Cu), aluminum (Al), tungsten (W), or titanium (Ti).

When viewed in a plan view, as a distance to a center of the substrate 110 decreases, widths of bottom surfaces 150b of the lower pads 150 may gradually increase. As shown in FIG. 1, as a total area of the lower pads 150 per a unit area of the substrate 110 increases, the widths of the bottom surfaces 150b of the lower pads 150 may increase, when viewed in a plan view. As the total area of the lower pads 150 per the unit area of the substrate 110 increases, the widths of top surfaces 150a of the lower pads 150 may increase, when viewed in a plan view. A first unit region UR1 and a second unit region UR2 may be provided to have the same area, when viewed in a plan view. As an example, a total area of the lower pads 150 in the first unit region UR1 may be larger than a total area of the lower pads 150 in the second unit region UR2. In this case, a width (e.g., width W1) of the bottom surface 150b of the lower pad 150 in the first unit region UR1 may be larger than a width (e.g., width W4) of the bottom surface 150b of the lower pad 150 in the second unit region UR2. In the present specification, a width of an element may be a length of the element measured in a direction parallel to a top surface 110a of the substrate 110.

A third insulating layer 140 may be disposed on the top surface 110a of the substrate 110. In some embodiments, a bottom surface of the third insulating layer 140 may contact the top surface 110a of the substrate 110. The third insulating layer 140 may include an insulating material. For example, the third insulating layer 140 may be formed of or may include at least one of silicon oxide, silicon nitride, or silicon oxynitride. The third insulating layer 140 may be composed of a single layer or may include a plurality of stacked layers.

A plurality of upper pads 160 may be provided in the third insulating layer 140. In example embodiments, top surfaces of the upper pads 160 may be at the same level as a top surface of the third insulating layer 140, and bottom surfaces of the upper pads 160 may be at the same level as a bottom surface of the third insulating layer 140. Each of the upper pads 160 may be electrically connected to a corresponding one of the penetration vias 115 (e.g., in a direct contact manner). For example, of the upper pads 160 may contact a corresponding one of the penetration vias 115. The upper pads 160 may include a conductive metal material. For example, the upper pads 160 may be formed of or may include at least one of copper (Cu), aluminum (Al), tungsten (W), or titanium (Ti).

When viewed in a plan view, as a distance to the center of the substrate 110 decreases, widths of top surfaces 160a of the upper pads 160 may gradually increase. As shown in FIG. 1, as a total area of the upper pads 160 per the unit area of the substrate 110 increases, the widths of the top surfaces 160a of the upper pads 160 may increase, when viewed in a plan view. As the total area of the upper pads 160 per the unit area of the substrate 110 increases, the widths of the bottom surfaces 160b of the upper pads 160 may increase, when viewed in a plan view. As an example, a total area of the upper pads 160 in the first unit region UR1 may be larger than a total area of the upper pads 160 in the second unit region UR2. In this case, a width (e.g., width W1) of the top surface 160a of the upper pad 160 in the first unit region UR1 may be larger than a width (e.g., width W4) of the top surface 160a of the upper pad 160 in the second unit region UR2. The top surface 160a of the upper pad 160 may correspond to the bottom surface 150b of the lower pad 150. For example, the top surface 160a of the upper pad 160 may face the bottom surface 150b of the lower pad 150, and the top surface 160a of the upper pad 160 may contact the bottom surface 150b of the lower pad 150.

In an embodiment, as shown in FIG. 1, each of the lower and upper pads 150 and 160 may have a circular shape, when viewed in a plan view. In an embodiment, as shown in FIG. 2A, the lower pad 150 may have a rectangular shape, when viewed in a plan view. In an embodiment, as shown in FIG. 2B, each of the lower and upper pads 150 and 160 may have a triangular shape, when viewed in a plan view. However, the inventive concept is not limited to these examples, and in an embodiment, each of the lower and upper pads 150 and 160 may have a polygonal shape having five or more sides or corners, when viewed in a plan view.

As shown in FIG. 4, the lower pads 150 may include a first lower pad 151, a second lower pad 152, a third lower pad 153, and a fourth lower pad 154, which are horizontally spaced apart from each other. When viewed in a plan view, the first lower pad 151 may be adjacent to the center of the substrate 110, the third lower pad 153 may be adjacent to an edge of the substrate 110, and the second lower pad 152 may be disposed between the first lower pad 151 and the third lower pad 153. The edge of the substrate 110 may be closer to the fourth lower pad 154 than to the third lower pad 153. A width W1 of a bottom surface of the first lower pad 151 may be larger than a width W5 of a bottom surface of the second lower pad 152. The width W5 of the bottom surface of the second lower pad 152 may be larger than a width W6 of a bottom surface of the third lower pad 153. The width W6 of the bottom surface of the third lower pad 153 may be larger than a width of a bottom surface of the fourth lower pad 154. For example, the width W1 of the bottom surface of the first lower pad 151 may be 110% to 150% of the width W5 of the bottom surface of the second lower pad 152. For example, the width W1 of the bottom surface of the first lower pad 151 may be larger than 150% of the width W6 of the bottom surface of the third lower pad 153 and may be equal to or smaller than 500% of the width W6. A width W3 of a top surface of the first lower pad 151 may be larger than a width of a top surface of the second lower pad 152. The width of the top surface of the second lower pad 152 may be larger than a width of a top surface of the third lower pad 153. The width of the top surface of the third lower pad 153 may be larger than a width of a top surface of the fourth lower pad 154. For example, the width of the top surface of the first lower pad 151 may be 110% to 150% of the width of the top surface of the second lower pad 152. For example, the width of the top surface of the first lower pad 151 may be larger than 150% of the width of the top surface of the third lower pad 153 and may be equal to or smaller than 500% of the width of the top surface of the third lower pad 153.

Each of the lower pads 150 may be provided such that a width (e.g., width W3) of the top surface 150a thereof is smaller than a width (e.g., width W1) of the bottom surface 150b thereof. As a distance to the bottom surface 150b decreases, the width of the lower pad 150 may increase. For example, each of the lower pads 150 may have a shape that tapers in a direction from the bottom surface 150b to the top surface 150a of the lower pad 150. An angle θ1 between the top surface 150a of the lower pad 150 and a side surface 150c of the lower pad 150 may be an obtuse angle. The angle θ1 between the top surface 150a of the lower pad 150 and the side surface 150c of the lower pad 150 may be greater than 90° and may be equal to or smaller than 170°. An angle between the bottom surface 150b of the lower pad 150 and the side surface 150c of the lower pad 150 may be an acute angle. For example, the angle between the bottom surface 150b of the lower pad 150 and the side surface 150c of the lower pad 150 may be greater than or equal to 10° and may be smaller than 90°. The lower pad 150 may have, for example, a trapezoidal shape, when viewed in a sectional view. In an embodiment, as a distance to the edge of the substrate 110 decreases, the shape of the lower pad 150 may be close to a triangular shape.

The upper pads 160 may include a first upper pad 161, a second upper pad 162, a third upper pad 163, and a fourth upper pad 164, which are horizontally spaced apart from each other. When viewed in a plan view, the first upper pad 161 may be adjacent to the center of the substrate 110, the third upper pad 163 may be adjacent to the edge of the substrate 110, and the second upper pad 162 may be disposed between the first upper pad 161 and the third upper pad 163. The edge of the substrate 110 may be closer to the fourth upper pad 164 than to the third upper pad 163. A top surface of the first upper pad 161 may have the width W1, and a top surface of the second upper pad 162 may have the width W5 smaller than the width W1. A top surface of the third upper pad 163 may have the width W6 smaller than the width W5 of the top surface of the second upper pad 162. The width W6 of the top surface of the third upper pad 163 may be larger than a width of a top surface of the fourth upper pad 164. For example, the width W1 of the top surface of the first upper pad 161 may be 110% to 150% of the width W5 of the top surface of the second upper pad 162. For example, the width W1 of the top surface of the first upper pad 161 may be larger than 150% of the width W6 of the top surface of the third upper pad 163 and may be equal to or smaller than 500% of the width W6. A width W2 of a bottom surface of the first upper pad 161 may be larger than a width of a bottom surface of the second upper pad 162. The width of the bottom surface of the second upper pad 162 may be larger than a width of a bottom surface of the third upper pad 163. The width of the bottom surface of the third upper pad 163 may be larger than a width of a bottom surface of the fourth upper pad 164. For example, the width W2 of the bottom surface of the first upper pad 161 may be 110% to 150% of the width of the bottom surface of the second upper pad 162. For example, the width W2 of the bottom surface of the first upper pad 161 may be larger than 150% of the width of the bottom surface of the third upper pad 163 and may be equal to or smaller than 500% of the width of the bottom surface of the third upper pad 163.

Each of the upper pads 160 may be provided such that a width (e.g., width W1) of the top surface 160a thereof is larger than a width (e.g., width W2) of the bottom surface 160b thereof. As a distance to the top surface 160a decreases, the width of the upper pad 160 may increase. For example, each of the upper pads 160 may have a shape that tapers in a direction from the top surface 160a to the bottom surface 160b of the upper pad 160. An angle θ2 between the bottom surface 160b of the upper pad 160 and a side surface 160c of the upper pad 160 may be an obtuse angle. For example, the angle θ2 between the bottom surface 160b of the upper pad 160 and the side surface 160c of the upper pad 160 may be greater than 90° and may be equal to or smaller than 170°. An angle between the top surface 160a of the upper pad 160 and the side surface 160c of the upper pad 160 may be an acute angle. For example, the angle between the top surface 160a of the upper pad 160 and the side surface 160c of the upper pad 160 may be greater than or equal to 10° and may be smaller than 90°. The upper pad 160 may have, for example, a trapezoidal shape, when viewed in a sectional view. In an embodiment, as a distance to the edge of the substrate 110 decreases, the shape of the upper pad 160 may be close to a triangular shape.

Referring back to FIGS. 1, 2A, 2B, 3, and 4, in an embodiment, the upper and lower pads 160 and 150 may be vertically overlapped with and aligned to each other. In another embodiment, the upper and lower pads 160 and 150 may be slightly misaligned from each other, unlike the illustrated structure. In the present specification, the lower pad 150 may be referred to as a lower pattern, and the upper pad 160 may be referred to as an upper pattern.

The uppermost one of the first semiconductor chips 100 may not include the penetration vias 115, the third insulating layer 140, and the upper pads 160. Except for this, the uppermost one of the first semiconductor chips 100 may be substantially the same as the first semiconductor chip 100 described above.

The first semiconductor chips 100, which are vertically adjacent to each other, may be electrically connected to each other through the upper pads 160 and the lower pads 150. Each of the upper pads 160 of a lower one of the adjacent ones of the first semiconductor chips 100 may be in direct contact with a corresponding one of the lower pads 150 of an upper first semiconductor chip 100. The third insulating layer 140 of the lower first semiconductor chip 100 may be in direct contact with the second insulating layer 130 of the upper first semiconductor chip 100. The lower pad 150 may be provided such that a width of a surface (e.g., a bottom surface), which is in contact with another semiconductor chip thereunder, is larger than a width of a surface (e.g., a top surface), which is not in contact with any other semiconductor chip. The upper pad 160 may be provided such that a width of a surface (e.g., a top surface), which is in contact with another semiconductor chip thereon, is larger than a width of a surface (e.g., a bottom surface), which is not in contact with any other semiconductor chip.

According to an embodiment of the inventive concept, as a distance to the center of the substrate 110 decreases, the widths of the upper and lower pads 160 and 150 may increase, the lower pad 150 may be provided such that a width of its top surface is smaller than a width of its bottom surface, and the upper pad 160 may be provided such that a width of its top surface is larger than a width of its bottom surface. Accordingly, even when a polishing process to be described below is performed, the top surface of the upper pad 160 and the bottom surface of the lower pad 150 may be formed to have a substantially flat shape without a dished portion. As a result, it may be possible to prevent a bonding failure between the upper pad 160 and the lower pad 150, to improve bonding efficiency in a process of bonding the stacked first semiconductor chips 100, and thereby to improve reliability of a semiconductor package.

The second semiconductor chip 500 may include a base substrate 510, a first base insulating layer 520, and a second base insulating layer 540. In an embodiment, the second semiconductor chip 500 may be one of logic chips, buffer chips, or memory chips. The second semiconductor chip 500 may be a semiconductor chip that is of a different kind from the first semiconductor chip 100, but the inventive concept is not limited to this example. The base substrate 510 may be formed of or may include at least one of semiconductor materials (e.g., silicon, germanium, or silicon germanium).

A lower via 515 may be provided in the base substrate 510. The lower via 515 may be provided to penetrate the base substrate 510. For example, the lower via 515 may extend from a top surface of the base substrate 510 to a bottom surface of the base substrate 510. In example embodiments, the top surface of the via 515 may be coplanar with the top surface of the base substrate 510, and a bottom surface of the via 515 may be coplanar with the bottom surface of the base substrate 510. In an embodiment, a plurality of the lower vias 515 may be provided. The lower via 515 may include a conductive metal material. For example, the lower via 515 may be formed of or may include at least one of copper (Cu), aluminum (Al), tungsten (W), or titanium (Ti). Although not shown, an insulating layer and/or a barrier layer may be further interposed between the lower via 515 and the base substrate 510.

The first base insulating layer 520 may be disposed on a bottom surface of the base substrate 510. The first base insulating layer 520 may include an insulating material. For example, the first base insulating layer 520 may be formed of or may include at least one of silicon oxide, silicon nitride, or silicon oxynitride. The first base insulating layer 520 may be composed of a single layer or may include a plurality of stacked layers.

Interconnection patterns 525 may be provided in the first base insulating layer 520. The first base insulating layer 520 may cover the interconnection patterns 525. The interconnection patterns 525 may be electrically connected to the lower vias 515. The interconnection patterns 525 may include a conductive metal material. For example, the interconnection patterns 525 may be formed of or may include at least one of copper (Cu), aluminum (Al), tungsten (W), or titanium (Ti).

The second base insulating layer 540 may be disposed on a top surface of the base substrate 510. The second base insulating layer 540 may include an insulating material. The second base insulating layer 540 may be formed of or may include at least one of silicon oxide, silicon nitride, or silicon oxynitride. The second base insulating layer 540 may be composed of a single layer or may include a plurality of stacked layers.

A plurality of first chip pads 560 may be provided adjacent to a top surface of the second semiconductor chip 500. The first chip pads 560 may be disposed in the second base insulating layer 540. In example embodiments, top surfaces of the first chip pads 560 may be at the same level as a top surface of the second base insulating layer 540, and bottom surfaces of the first chip pads 560 may be at the same level as a bottom surface of the second base insulating layer 540. Each of the first chip pads 560 may be electrically connected to a corresponding one of the lower vias 515 (e.g., in a direct contact manner). In example embodiments, bottom surfaces of each of the first chip pads 560 may contact a top surface of a corresponding one of the lower vias 515. Each of the first chip pads 560 may be in direct contact with a corresponding one of the lower pads 150 of the first semiconductor chip 100 adjacent thereto. For example, a top surface of each of the first chip pads 560 may contact a bottom surface 150*b* of a corresponding one of the lower pads 150. The second base insulating layer 540 may be in direct contact with the second insulating layer 130 of the first semiconductor chip 100 adjacent thereto. The first chip pads 560 may include a conductive metal material. For example, the first chip pads 560 may be formed of or may include at least one of copper (Cu), aluminum (Al), tungsten (W), or titanium (Ti).

As a distance to the center of the substrate 110 decreases, widths of top surfaces of the first chip pads 560 may gradually increase. As a distance to the center of the substrate 110 decreases, widths of bottom surfaces of the first chip pads 560 may gradually increase. When viewed in a plan view, as a total area of the first chip pads 560 per the unit area of the substrate 110 increases, the widths of the top surfaces of the first chip pads 560 may increase. When viewed in a plan view, as the total area of the first chip pads 560 per the unit area of the substrate 110 increases, the widths of the bottom surfaces of the first chip pads 560 may increase. Each of the first chip pads 560 may be provided such that a width of a top surface thereof is smaller than a width of a bottom surface thereof. The width of the first chip pad 560 may increase, as a distance to the bottom surface thereof decreases. When viewed in a sectional view, the first chip pad 560 may have, for example, a trapezoidal shape. When viewed in a plan view, the first chip pad 560 may have one of a circular shape, a triangular shape, a rectangular shape, or polygonal shapes having five or more sides or corners.

Second chip pads 550 may be provided in the first base insulating layer 520. The second chip pads 550 may be disposed adjacent to a bottom surface of the first base insulating layer 520. The second chip pads 550 may be electrically connected to the interconnection patterns 525. The second chip pads 550 may include a conductive metal material. For example, the second chip pads 550 may be formed of or may include at least one of copper (Cu), aluminum (Al), tungsten (W), or titanium (Ti).

Outer terminals 400 may be provided on a bottom surface of the second semiconductor chip 500. The outer terminals 400 may be disposed on bottom surfaces of the second chip pads 550 and may be electrically connected to the second chip pads 550. For example, each of the outer terminals 400 may contact a corresponding one of the second chip pads 550. The outer terminals 400 may be coupled to an external device. Accordingly, electrical signals may be transmitted to or output from the second chip pads 550 through the outer terminals 400. The outer terminals 400 may include at least one of solder balls, solder bumps, or solder pillars. The outer terminals 400 may include a conductive metal material. For example, the outer terminals 400 may be formed of or may include at least one of tin (Sn), lead (Pb), silver (Ag), zinc (Zn), nickel (Ni), gold (Au), copper (Cu), aluminum (Al), or bismuth (Bi).

Figure 5:
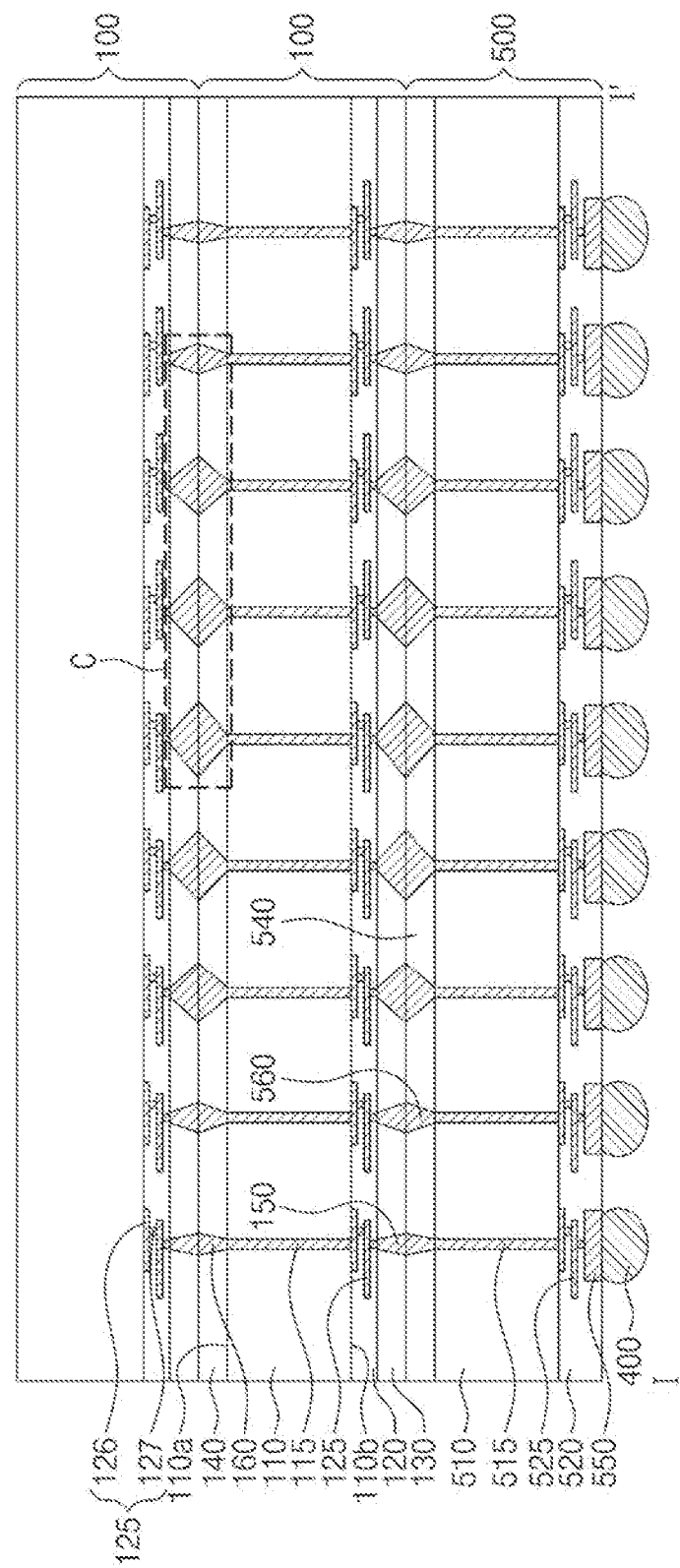
FIG. 5 is a sectional view taken along the line I-I' of FIG. 1 to illustrate a semiconductor package including a semiconductor device, according to an example embodiment of the inventive concept.
Figure 6:
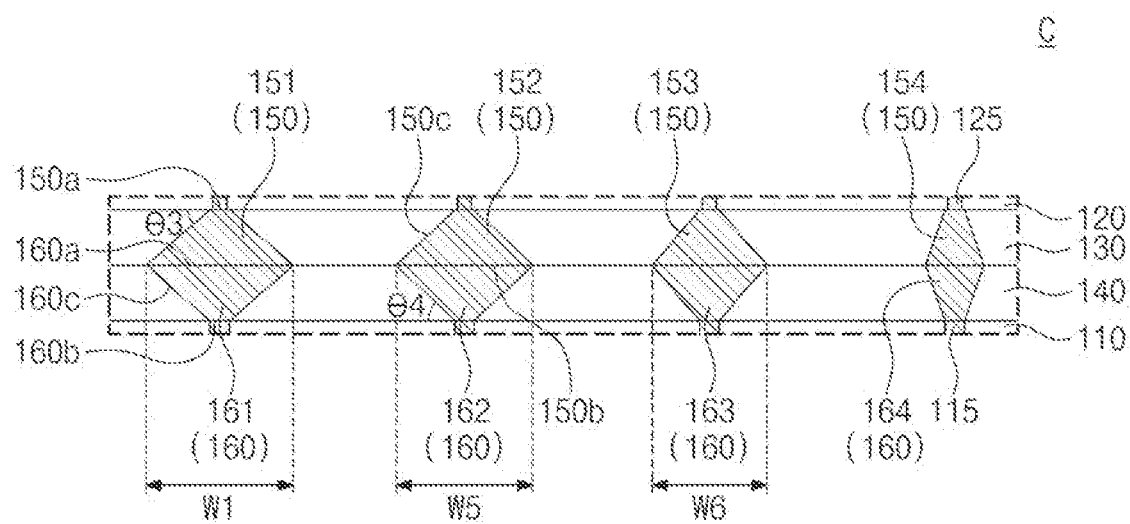
FIG. 6 is an enlarged sectional view illustrating a portion C of FIG. 5.

FIG. 5 is a sectional view taken along the line I-I' of FIG. 1 to illustrate a semiconductor package including a semiconductor device according to an example embodiment of the inventive concept. FIG. 6 is an enlarged sectional view illustrating a portion C of FIG. 5. For concise description, a previously described element may be identified by the same reference number without repeating an overlapping description thereof.

Referring to FIGS. 1, 5, and 6, a semiconductor package may include a plurality of the first semiconductor chips 100, which are stacked, and the second semiconductor chip 500. Each of the first semiconductor chips 100 may include the substrate 110, the first insulating layer 120, and the second insulating layer 130. The penetration vias 115 may be provided to penetrate the substrate 110. The interconnection structures 125 may be provided in the first insulating layer 120. Each of the interconnection structures 125 may include the conductive patterns 126 and the conductive vias 127. The second semiconductor chip 500 may include the base substrate 510, the first base insulating layer 520, and the second base insulating layer 540. The lower vias 515 may be provided to penetrate the base substrate 510. The interconnection patterns 525 may be provided in the first base insulating layer 520. The first chip pads 560 may be provided in the second base insulating layer 540. When viewed in a sectional view, the first chip pad 560 may have, for example, a substantially triangular shape. For example, the first chip pad 560 may have a shape in which the bottom surface of the first chip pad 560 has a relatively small width. In example embodiments, the width of the bottom surface of the first chip pad 560 may be the same as a width of the lower via 515 with which the first chip pad 560 is in contact. The second chip pads 550 may be provided in the first base insulating layer 520. The outer terminals 400 may be provided on the bottom surface of the second semiconductor chip 500.

The lower pads 150 may be provided in the second insulating layer 130. When viewed in a plan view, as a distance to the center of the substrate 110 decreases, widths of the bottom surfaces 150b of the lower pads 150 may gradually increase. When viewed in a plan view, as a total area of the lower pads 150 per the unit area of the substrate 110 increases, widths of the bottom surfaces 150b of the lower pads 150 may increase.

The upper pads 160 may be provided in the third insulating layer 140. When viewed in a plan view, as a distance to the center of the substrate 110 decreases, widths of the top surfaces 160a of the upper pads 160 may gradually increase. As a total area of the upper pads 160 per the unit area of the substrate 110 increases, the widths of the top surfaces 160a of the upper pads 160 may increase, when viewed in a plan view.

As shown in FIG. 6, the lower pads 150 may include the first lower pad 151, the second lower pad 152, the third lower pad 153, and the fourth lower pad 154, which are horizontally spaced apart from each other. The width W1 of the bottom surface of the first lower pad 151 may be larger than the width W5 of the bottom surface of the second lower pad 152. The width W5 of the bottom surface of the second lower pad 152 may be larger than the width W6 of the bottom surface of the third lower pad 153. The width W6 of the bottom surface of the third lower pad 153 may be larger than the width of the bottom surface of the fourth lower pad 154. For example, the width W1 of the bottom surface of the first lower pad 151 may be 110% to 150% of the width W5 of the bottom surface of the second lower pad 152. For example, the width W1 of the bottom surface of the first lower pad 151 may be larger than 150% of the width W6 of the bottom surface of the third lower pad 153 and may be equal to or smaller than 500% of the width W6.

Each of the lower pads 150 may be provided such that a width of the top surface 150a is smaller than a width of the bottom surface 150b. As a distance to the bottom surface 150b decreases, the width of the lower pad 150 may increase. An angle θ3 between the top surface of the second insulating layer 130 and the side surface 150c of the lower pad 150 may be an acute angle. For example, the angle θ3 between the top surface of the second insulating layer 130 and the side surface 150c of the lower pad 150 may be equal to or greater than 10° and may be smaller than 90°. When viewed in a sectional view, the lower pad 150 may have, for example, a substantially triangular shape. For example, the lower pad 150 may have a shape in which the top surface 150a of the lower pad 150 has a relatively small width. In example embodiments, the width of the top surface 150a of the lower pad 150 may be the same as a width of the conductive via 127 with which the lower pad 150 is in contact.

The upper pads 160 may include the first upper pad 161, the second upper pad 162, the third upper pad 163, and the fourth upper pad 164, which are horizontally spaced apart from each other. The width W1 of the top surface of the first upper pad 161 may be larger than the width W5 of the top surface of the second upper pad 162. The width W5 of the top surface of the second upper pad 162 may be larger than the width W6 of the top surface of the third upper pad 163. The width W6 of the top surface of the third upper pad 163 may be larger than the width of the top surface of the fourth upper pad 164. For example, the width W1 of the top surface of the first upper pad 161 may be 110% to 150% of the width W5 of the top surface of the second upper pad 162. For example, the width W1 of the top surface of the first upper pad 161 may be larger than 150% of the width W6 of the top surface of the third upper pad 163 and may be equal to or smaller than 500% of the width W6.

Each of the upper pads 160 may be provided such that a width (e.g., width W1) of the top surface 160a is larger than a width of the bottom surface 160b. As a distance to the top surface 160a decreases, the width of the upper pad 160 may increase. An angle θ4 between the bottom surface of the third insulating layer 140 and the side surface 160c of the upper pad 160 may be an acute angle. For example, the angle θ4 between the bottom surface of the third insulating layer 140 and the side surface 160c of the upper pad 160 may be equal to or greater than 10° and may be smaller than 90°. When viewed in a sectional view, the upper pad 160 may have, for example, a substantially triangular shape. For example, the upper pad 160 may have a shape in which the bottom surface 160b of the upper pad 160 has a relatively small width. In example embodiments, the width of the bottom surface 160b of the upper pad 160 may be the same as a width of the penetration via 115 with which the upper pad 160 is in contact.

Figure 7:
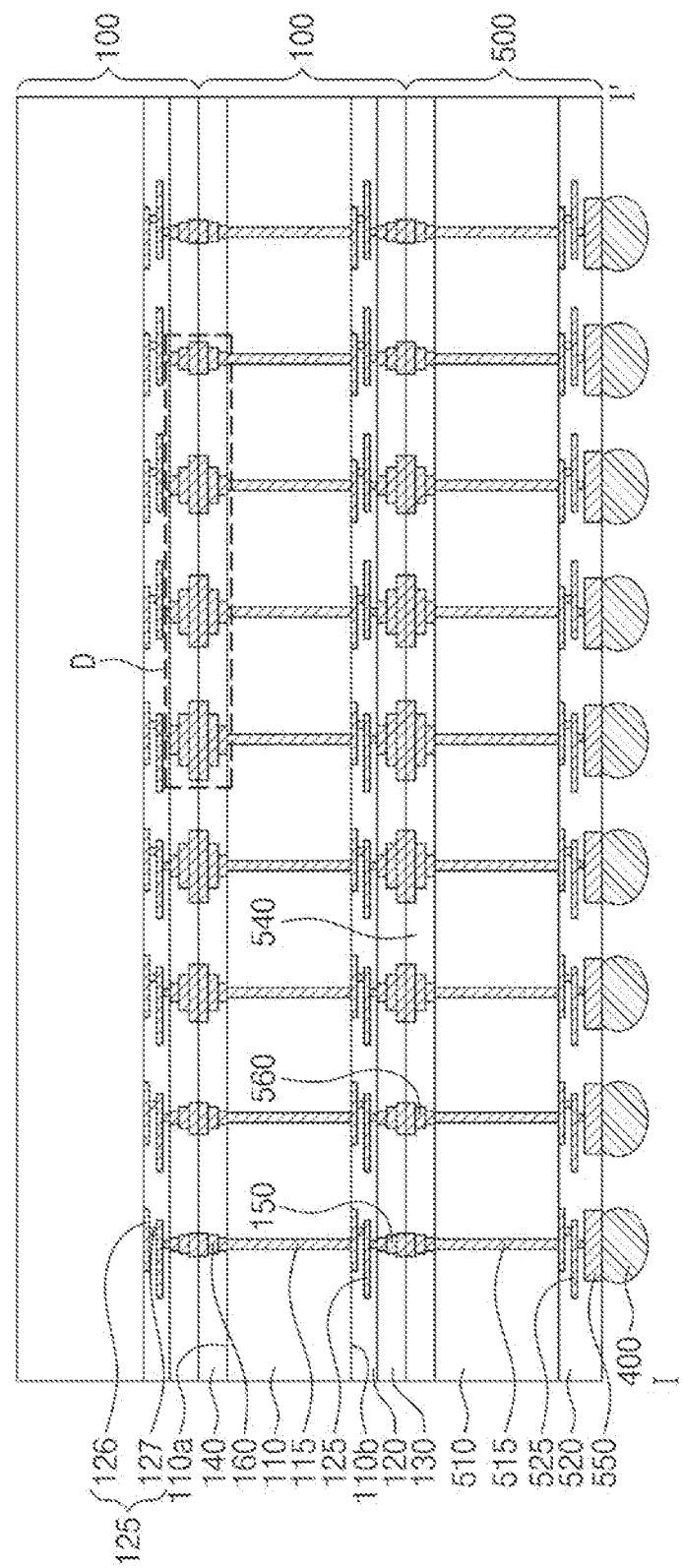
FIG. 7 is a sectional view taken along the line I-I' of FIG. 1 to illustrate a semiconductor package including a semiconductor device, according to an example embodiment of the inventive concept.
Figure 8:
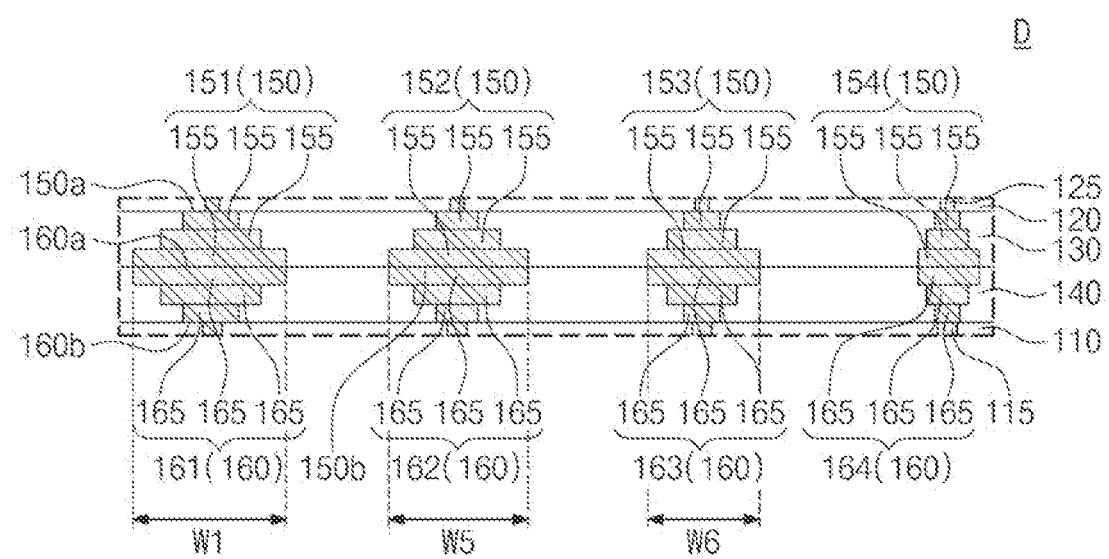
FIG. 8 is an enlarged sectional view illustrating a portion D of FIG. 7.

FIG. 7 is a sectional view taken along the line I-I' of FIG. 1 to illustrate a semiconductor package including a semiconductor device according to an example embodiment of the inventive concept. FIG. 8 is an enlarged sectional view illustrating a portion D of FIG. 7. For concise description, a previously described element may be identified by the same reference number without repeating an overlapping description thereof.

Referring to FIGS. 1, 7, and 8, a semiconductor package may include the first semiconductor chips 100, which are stacked, and the second semiconductor chip 500. Each of the first semiconductor chips 100 may include the substrate 110, the first insulating layer 120, and the second insulating layer 130. The penetration vias 115 may be provided to penetrate the substrate 110. The interconnection structures 125 may be provided in the first insulating layer 120. Each of the interconnection structures 125 may include the conductive patterns 126 and the conductive vias 127. The second semiconductor chip 500 may include the base substrate 510, the first base insulating layer 520, and the second base insulating layer 540. The lower vias 515 may be provided to penetrate the base substrate 510. The interconnection patterns 525 may be provided in the first base insulating layer 520. The first chip pads 560 may be provided in the second base insulating layer 540. When viewed in a sectional view, the first chip pad 560 may have, for example, a stepwise shape. The second chip pads 550 may be provided in the first base insulating layer 520. The outer terminals 400 may be provided on the bottom surface of the second semiconductor chip 500.

As shown in FIG. 8, the lower pads 150 may be provided in the second insulating layer 130. When viewed in a plan view, as a distance to the center of the substrate 110 decreases, widths of the bottom surfaces 150b of the lower pads 150 may gradually increase. When viewed in a plan view, as a total area of the lower pads 150 per the unit area of the substrate 110 increases, the widths of the bottom surfaces 150b of the lower pads 150 may increase. Each of the lower pads 150 may include a plurality of first sub-pads 155, which are vertically stacked. The first sub-pads 155 may be respectively provided in the second insulating layers 130 which are stacked. In example embodiments, a bottom surface of the lowermost one of the first sub-pads 155 (e.g., bottom surface 150b of the lower pad 150) may be at the same level as the bottom surface of the second insulating layer 130, and a top surface of the uppermost one of the first sub-pads 155 (e.g., top surface 150a of the lower pad 150) may be at the same level as the top surface of the second insulating layer 130. The first sub-pads 155 may have at least two different widths. As a distance to a bottom surface of the second insulating layer 130 decreases, the widths of the first sub-pads 155 may gradually increase. When viewed in a sectional view, the lower pad 150 may have, for example, a stepwise shape.

The upper pads 160 may be provided in the third insulating layer 140. When viewed in a plan view, as a distance to the center of the substrate 110 decreases, the widths of the top surfaces 160a of the upper pads 160 may gradually increase. As a total area of the upper pads 160 per the unit area of the substrate 110 increases, the widths of the top surfaces 160a of the upper pads 160 may increase, when viewed in a plan view. Each of the upper pads 160 may include a plurality of second sub-pads 165, which are vertically stacked. In an embodiment, the second sub-pads 165 may be respectively provided in the third insulating layers 140 which are stacked. In example embodiments, a bottom surface of the lowermost one of the second sub-pads 165 (e.g., bottom surface 160b of the upper pad 160) may be at the same level as the bottom surface of the third insulating layer 140, and a top surface of the uppermost one of the second sub-pads 165 (e.g., top surface 160a of the upper pad 160) may be at the same level as the top surface of the third insulating layer 140. The second sub-pads 165 may have at least two different widths. As a distance to the bottom surface of the third insulating layer 140 decreases, the widths of the second sub-pads 165 may increase. When viewed in a sectional view, the upper pad 160 may have, for example, a stepwise shape.

The lower pads 150 may include the first lower pad 151, the second lower pad 152, the third lower pad 153, and the fourth lower pad 154, which are horizontally spaced apart from each other. The width W1 of the bottom surface of the first lower pad 151 may be larger than the width W5 of the bottom surface of the second lower pad 152. The width W5 of the bottom surface of the second lower pad 152 may be larger than the width W6 of the bottom surface of the third lower pad 153. The width W6 of the bottom surface of the third lower pad 153 may be larger than the width of the bottom surface of the fourth lower pad 154. For example, the width W1 of the bottom surface of the first lower pad 151 may be 110% to 150% of the width W5 of the bottom surface of the second lower pad 152. For example, the width W1 of the bottom surface of the first lower pad 151 may be larger than 150% of the width W6 of the bottom surface of the third lower pad 153 and may be equal to or smaller than 500% of the width W6. Each of the lower pads 150 may be provided such that a width of the top surface 150a is smaller than a width (e.g., width W1) of the bottom surface 150b. As a distance to the bottom surface 150b decreases, the width of the lower pad 150 may increase.

The upper pads 160 may include the first upper pad 161, the second upper pad 162, the third upper pad 163, and the fourth upper pad 164, which are horizontally spaced apart from each other. The width W1 of the top surface of the first upper pad 161 may be larger than the width W5 of the top surface of the second upper pad 162. The width W5 of the top surface of the second upper pad 162 may be larger than the width W6 of the top surface of the third upper pad 163. The width W6 of the top surface of the third upper pad 163 may be larger than the width of the top surface of the fourth upper pad 164. For example, the width W1 of the top surface of the first upper pad 161 may be 110% to 150% of the width W5 of the top surface of the second upper pad 162. For example, the width W1 of the top surface of the first upper pad 161 may be larger than 150% of the width W6 of the top surface of the third upper pad 163 and may be equal to or smaller than 500% of the width W6. Each of the upper pads 160 may be provided such that a width (e.g., width W1) of the top surface 160a is larger than a width of the bottom surface 160b. As a distance to the top surface 160a decreases, the width of the upper pad 160 may increase.

Figure 9:
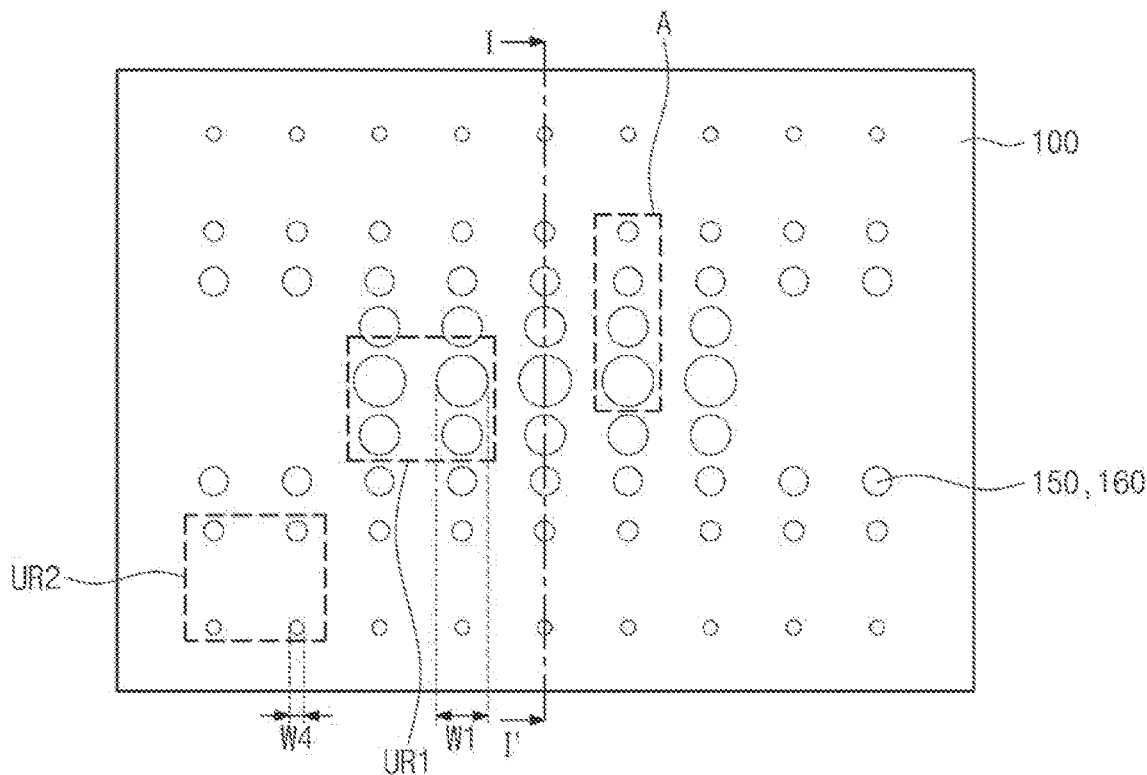
FIG. 9 is a plan view illustrating a semiconductor package including a semiconductor device, according to an example embodiment of the inventive concept.

FIG. 9 is a plan view illustrating a semiconductor package including a semiconductor device according to an example embodiment of the inventive concept. Each of FIGS. 2A and 2B described above may correspond to an enlarged view of a portion 'A' of FIG. 9. Each of FIGS. 3, 5, and 7 described above may correspond to an enlarged sectional view taken along a line I-I' of FIG. 9. Except for a difference in the planar arrangement of the lower and upper pads 150 and 160, the semiconductor package according to the present embodiment may be the same as those in the previously-described embodiments.

Figure 10:
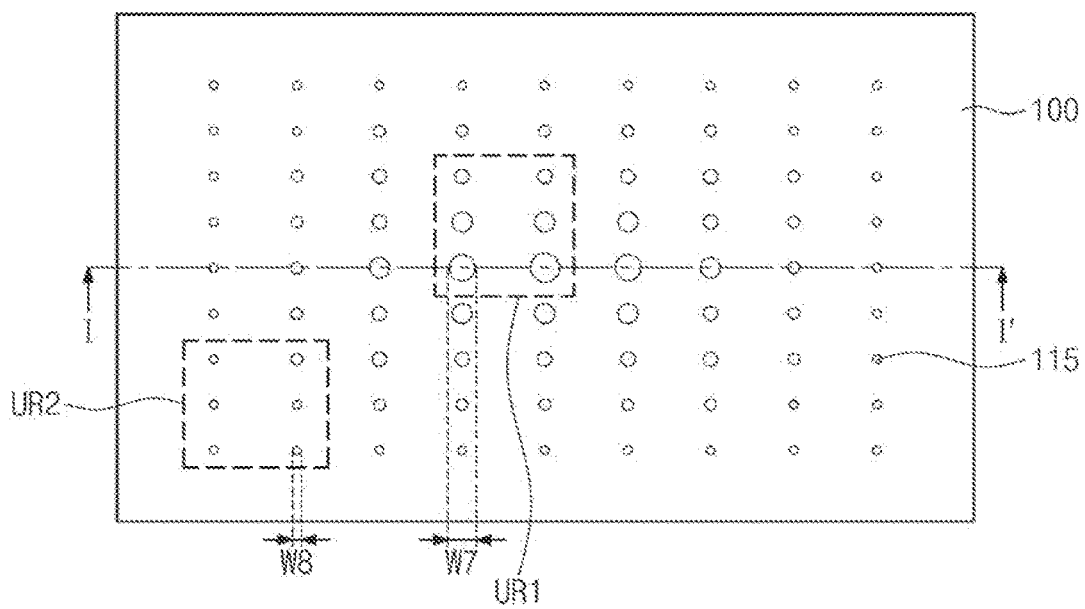
FIG. 10 is a plan view illustrating a semiconductor package including a semiconductor device, according to an example embodiment of the inventive concept.
Figure 11:
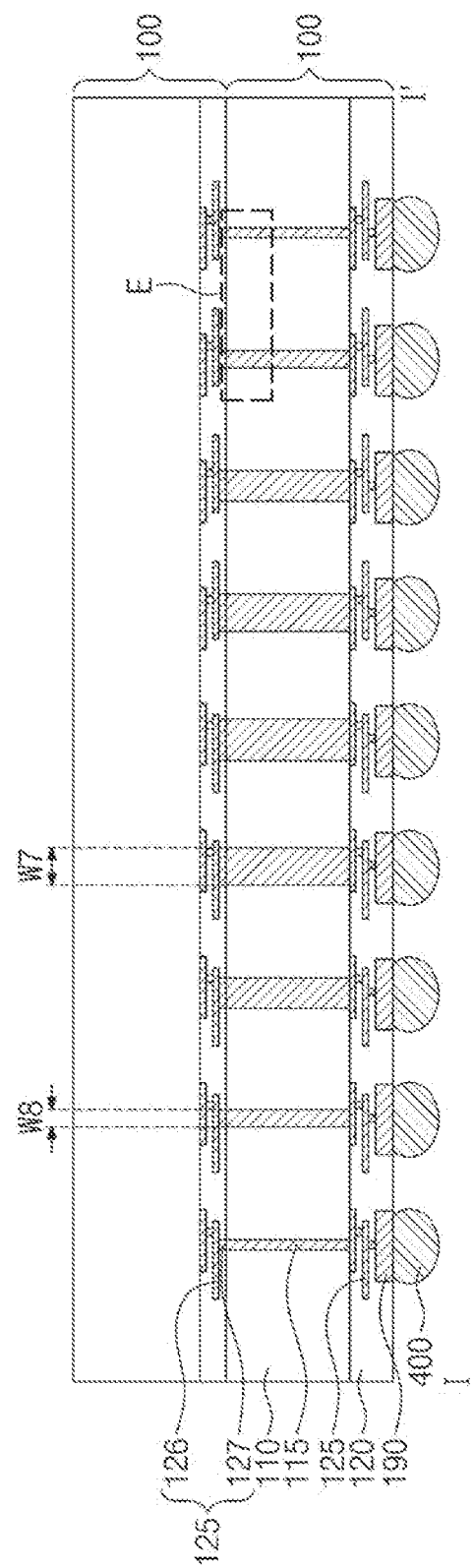
FIG. 11 is a sectional view taken along a line I-I' of FIG. 10 to illustrate a semiconductor package including a semiconductor device, according to an example embodiment of the inventive concept.

FIG. 10 is a plan view illustrating a semiconductor package including a semiconductor device according to an example embodiment of the inventive concept. FIG. 11 is a sectional view taken along a line I-I' of FIG. 10 to illustrate a semiconductor package including a semiconductor device according to an embodiment of the inventive concept. FIG.

12 is an enlarged sectional view illustrating a portion B of FIG. 11. For concise description, a previously described element may be identified by the same reference number without repeating an overlapping description thereof.

Figure 12:
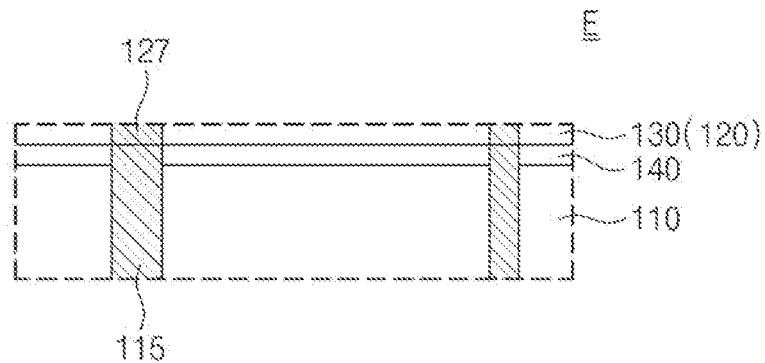
FIG. 12 is an enlarged sectional view illustrating a portion B of FIG. 11.

Referring to FIGS. 10, 11, and 12, a semiconductor package may include the first semiconductor chips 100, which are stacked. Each of the first semiconductor chips 100 may include the substrate 110 and the first insulating layer 120. The interconnection structures 125 may be provided in the first insulating layer 120. Each of the interconnection structures 125 may include the conductive patterns 126 and the conductive vias 127. When viewed in a plan view, as a distance to the center of the substrate 110 decreases, widths of the lowermost ones of the conductive vias 127 may gradually increase. However, the inventive concept is not limited to this example, and in an embodiment, the lowermost ones of the conductive vias 127, which are horizontally spaced apart from each other, may be provided to have the same width, unlike the illustrated structure.

The lowermost one of the first semiconductor chips 100 may further include connection pads 190. The connection pads 190 may be provided near the bottom surface of the first insulating layer 120 of the lowermost one of the first semiconductor chips 100. For example, bottom surfaces of the connection pads 190 may be coplanar with the bottom surface of the first insulating layer 120 of the lowermost one of the first semiconductor chips 100. The connection pads 190 may be electrically connected to the interconnection structures 125 of the lowermost one of the first semiconductor chips 100. For example, a top surface of each of the connection pads 190 may contact a bottom surface of a corresponding one of the conductive vias 127. The connection pads 190 may include a conductive metal material. For example, the connection pads 190 may be formed of or may include at least one of copper (Cu), aluminum (Al), tungsten (W), or titanium (Ti). The outer terminals 400 may be provided on the bottom surface of the lowermost one of the first semiconductor chips 100. The outer terminals 400 may be provided on bottom surfaces of the connection pads 190. The first semiconductor chip 100 may not include the lower and upper pads described above.

The penetration vias 115 may be provided to penetrate the substrate 110. When viewed in a plan view, as a distance to the center of the substrate 110 decreases, widths of the penetration vias 115 (e.g., widths of bottom surfaces of the penetration vias 115) may gradually increase. As an example, the penetration vias 115 may include a first via, a second via, and a third via. When viewed in a plan view, the first via may be disposed adjacent to the center of the substrate, the third via may be disposed adjacent to the edge of the substrate, and the second via may be disposed between the first via and the third via. In this case, a width of the first via may be larger than a width of the second via, and the width of the second via may be larger than a width of the third via.

When viewed in a plan view, as a total area of the penetration vias 115 per the unit area of the substrate 110 increases, the widths of the penetration vias 115 may increase. As an example, the total area of the penetration vias 115 in the first unit region UR1 may be larger than the total area of the penetration vias 115 in the second unit region UR2. In this case, a width (e.g., width W7) of the penetration via 115 in the first unit region UR1 may be larger than a width (e.g., width W8) of the penetration via 115 in the second unit region UR2. In an embodiment, each of the lowermost ones of the conductive vias 127 may have substantially the same width as the penetration via 115, which is in contact with the same, but the inventive concept is not limited to this example. In an embodiment, the uppermost one of the first semiconductor chips 100 may not include the penetration vias 115.

As shown in FIG. 12, the first insulating layer 120 may include a plurality of stacked insulating layers, and the lowermost layer of the first insulating layer 120 may be referred to as the second insulating layer 130. The lowermost ones of the conductive vias 127 may be provided in the second insulating layer 130. The third insulating layer 140 may be provided on the top surface 110a of the substrate 110. The penetration via 115 may be provided to penetrate the third insulating layer 140. The third insulating layer 140 may be provided to cover upper side surfaces of the penetration vias 115. For example, top surfaces of the penetration vias 115 may be coplanar with a top surface of the third insulating layer 140, and bottom surfaces of the penetration vias 115 may be coplanar with a bottom surface of the substrate 110. Each of the penetration vias 115 may be in direct contact with the lowermost corresponding one of the conductive vias 127 of the first semiconductor chip 100 thereon. The third insulating layer 140 of a lower one of the first semiconductor chips 100 may be in direct contact with the second insulating layer 130 of an upper one of the first semiconductor chips 100. In the present specification, the lowermost one of the conductive via 127 may be referred to as a lower pattern, and the penetration via 115 may be referred to as an upper pattern.

Figure 13:
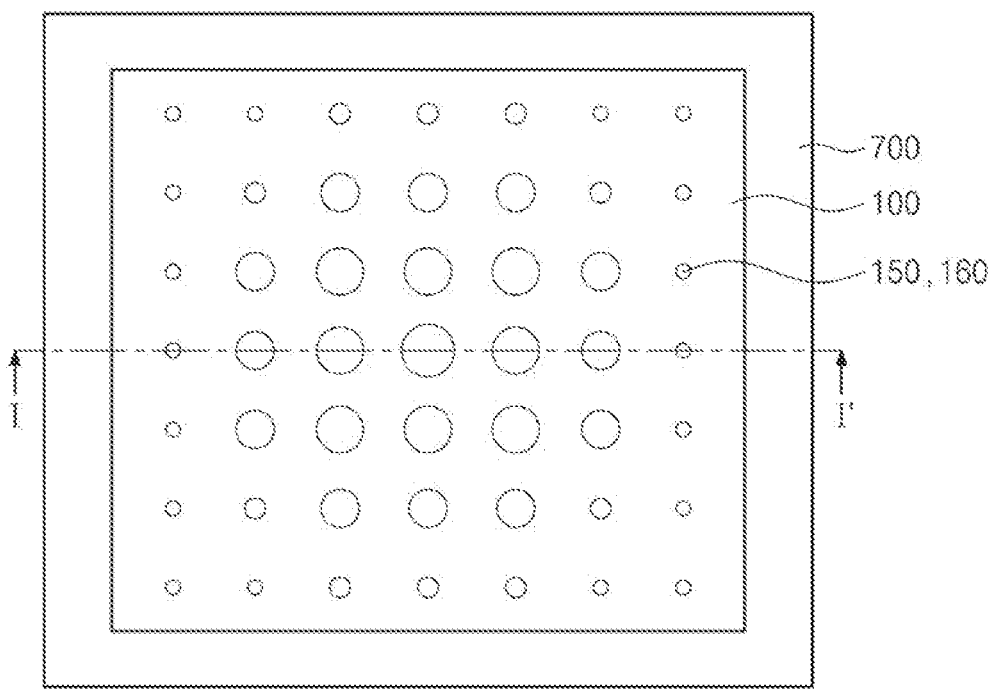
FIG. 13 is a plan view illustrating a semiconductor package including a semiconductor device, according to an example embodiment of the inventive concept.
Figure 14:
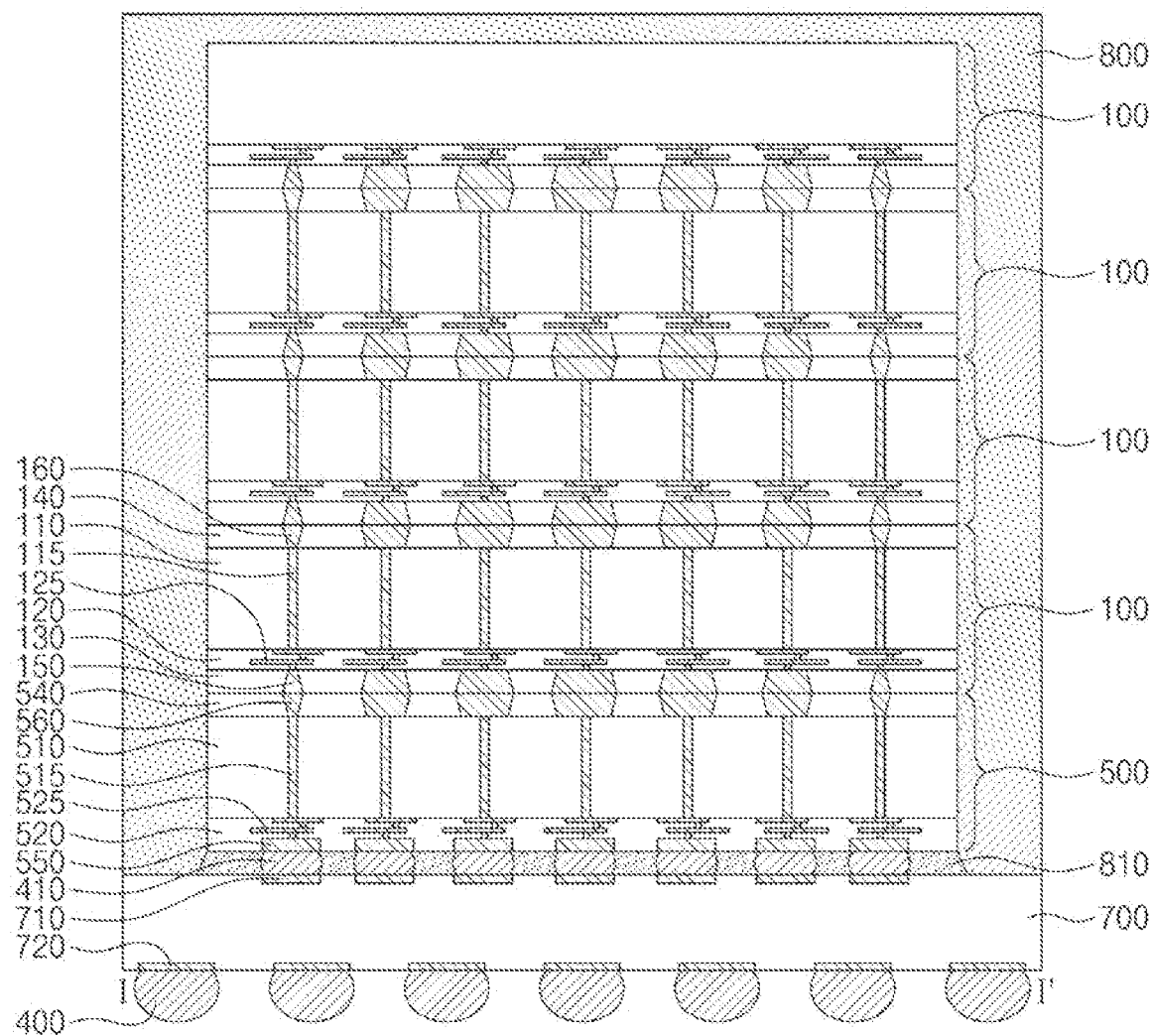
FIG. 14 is a sectional view taken along a line I-I' of FIG. 13 to illustrate a semiconductor package including a semiconductor device, according to an example embodiment of the inventive concept.

FIG. 13 is a plan view illustrating a semiconductor package including a semiconductor device according to an example embodiment of the inventive concept. FIG. 14 is a sectional view taken along a line I-I' of FIG. 13 to illustrate a semiconductor package including a semiconductor device according to an embodiment of the inventive concept. For concise description, a previously described element may be identified by the same reference number without repeating an overlapping description thereof.

Referring to FIGS. 13 and 14, a semiconductor package may include a package substrate 700, the first semiconductor chips 100, which are stacked, and the second semiconductor chip 500.

The package substrate 700 may be, for example, a printed circuit board (PCB). The package substrate 700 may include a single insulating layer or a plurality of stacked insulating layers. The package substrate 700 may include substrate pads 710 and terminal pads 720. The substrate pads 710 may be adjacent to a top surface of the package substrate 700, and the terminal pads 720 may be adjacent to a bottom surface of the package substrate 700. The substrate pads 710 may be exposed to the outside of the package substrate 700 near the top surface of the package substrate 700. The substrate pads 710 and the terminal pads 720 may be electrically connected to each other by internal interconnection lines (not shown) in the package substrate 700. The substrate pads 710 and the terminal pads 720 may include a conductive metal material. For example, the substrate pads 710 and the terminal pads 720 may be formed of or may include at least one of copper (Cu), aluminum (Al), tungsten (W), or titanium (Ti). The outer terminals 400 may be provided on the bottom surface of the package substrate 700.

The second semiconductor chip 500 may be mounted on the package substrate 700. The second semiconductor chip 500 may include the base substrate 510, the first base insulating layer 520, and the second base insulating layer 540. The lower vias 515 may be provided to penetrate the base substrate 510. The interconnection patterns 525 may be provided in the first base insulating layer 520. The first chip pads 560 may be provided in the second base insulating layer 540. The second chip pads 550 may be provided in the first base insulating layer 520.

The first semiconductor chips 100 may be vertically stacked on the second semiconductor chip 500. The first semiconductor chips 100 may constitute a chip stack. The first semiconductor chips 100 may include high bandwidth memory (HBM) chips. For example, the first semiconductor chips 100 may include DRAM chips. The first semiconductor chip 100 may include the substrate 110, the first insulating layer 120, the second insulating layer 130, and the third insulating layer 140. The penetration vias 115 may be provided to penetrate the substrate 110. The interconnection structures 125 may be provided in the first insulating layer 120. The lower pads 150 may be provided in the second insulating layer 130. The upper pads 160 may be provided in the third insulating layer 140. The lower and upper pads 150 and 160 may have the same features as those described with reference to FIGS. 3 to 8. However, the inventive concept is not limited to this example, and in an embodiment, the uppermost one of the first semiconductor chips 100 may not include the penetration vias 115, the third insulating layer 140, and the upper pads 160. The number of the first semiconductor chips 100 stacked is not limited to the example shown in FIG. 13 and may be variously changed.

First connection terminals 410 may be interposed between the package substrate 700 and the second semiconductor chip 500. The first connection terminals 410 may be interposed between the second chip pads 550 and the substrate pads 710. The package substrate 700 and the second semiconductor chip 500 may be electrically connected to each other by the first connection terminals 410. For example, the first connection terminals 410 may include at least one of solder balls, solder bumps, or solder pillars. The first connection terminals 410 may include a conductive metal material. For example, the first connection terminals 410 may be formed of or may include at least one of tin (Sn), lead (Pb), silver (Ag), zinc (Zn), nickel (Ni), gold (Au), copper (Cu), aluminum (Al), or bismuth (Bi).

A first under-fill layer 810 may be interposed between the package substrate 700 and the second semiconductor chip 500. The first under-fill layer 810 may be provided to fill a space between the first connection terminals 410 and to seal or encapsulate the first connection terminals 410. The first under-fill layer 810 may be formed of or may include an insulating polymer (e.g., an epoxy-based polymer).

A mold layer 800 may be provided on the package substrate 700. The mold layer 800 may cover the top surface of the package substrate 700, side surfaces of the second semiconductor chip 500, and top and side surfaces of the first semiconductor chips 100. In an embodiment, the mold layer 800 may be provided to cover the top surface of the uppermost one of the first semiconductor chips 100. However, the inventive concept is not limited to this example, and in an embodiment, the mold layer 800 may be provided to expose the top surface of the uppermost one of the first semiconductor chips 100, unlike the illustrated structure. The mold layer 800 may be formed of or may include an insulating polymer (e.g., an epoxy-based polymer).

Figure 15:
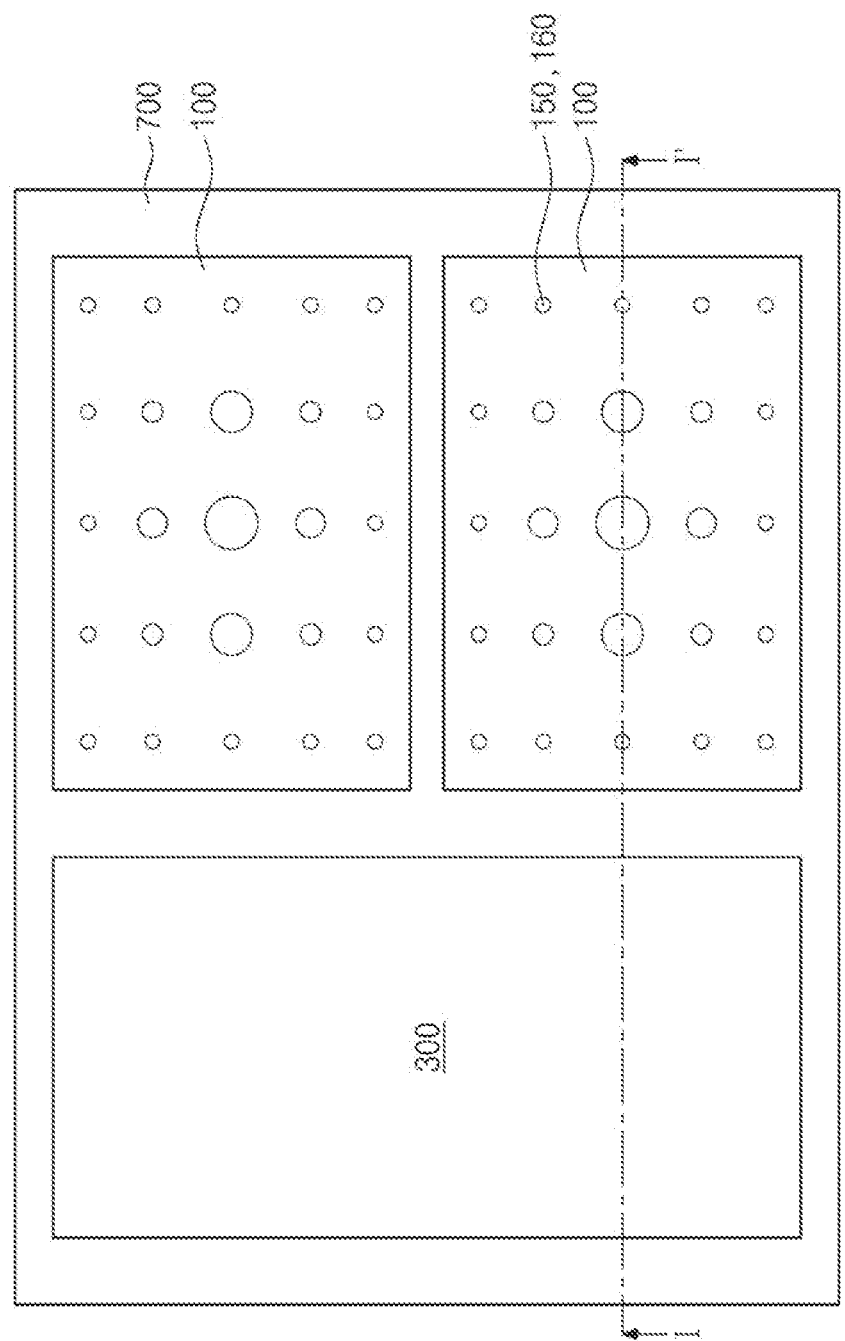
FIG. 15 is a plan view illustrating a semiconductor package including a semiconductor device, according to an example embodiment of the inventive concept.
Figure 16:
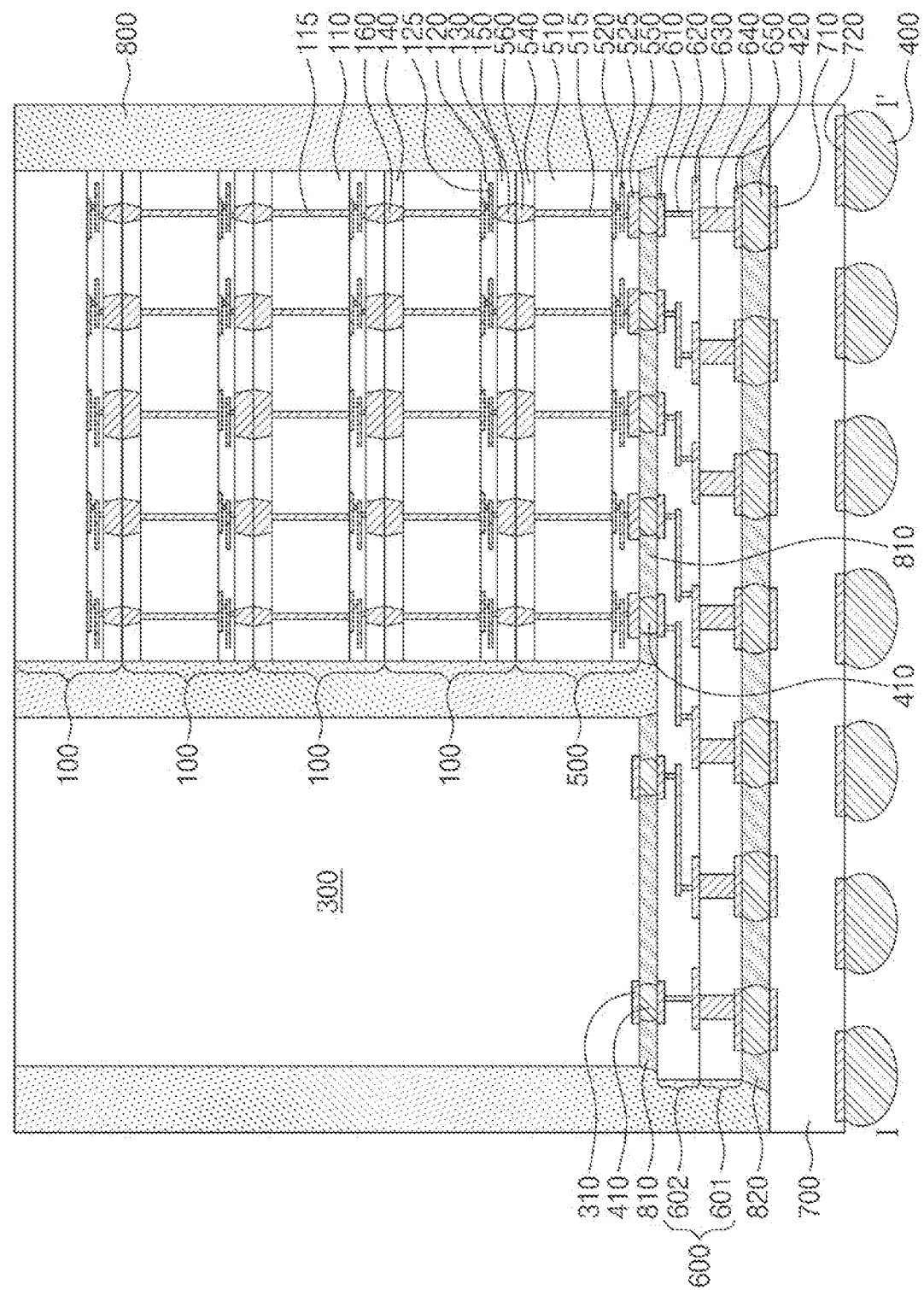
FIG. 16 is a sectional view taken along a line I-I' of FIG. 15 to illustrate a semiconductor package including a semiconductor device, according to an example embodiment of the inventive concept.

FIG. 15 is a plan view illustrating a semiconductor package including a semiconductor device according to an example embodiment of the inventive concept. FIG. 16 is a sectional view taken along a line I-I' of FIG. 15 to illustrate a semiconductor package including a semiconductor device according to an example embodiment of the inventive concept. For concise description, a previously described element may be identified by the same reference number without repeating an overlapping description thereof.

Referring to FIGS. 15 and 16, a semiconductor package may further include a third semiconductor chip 300 and an interposer substrate 600, in addition to the package substrate 700, the first semiconductor chips 100, which are stacked, and the second semiconductor chip 500.

The package substrate 700 may include the substrate pads 710 and the terminal pads 720. The outer terminals 400 may be provided on the bottom surface of the package substrate 700.

The interposer substrate 600 may be disposed on the package substrate 700. The interposer substrate 600 may include a substrate layer 601 and an interconnection layer 602 on the substrate layer 601.

The substrate layer 601 may include a plurality of penetration electrodes 640 and a plurality of first conductive pads 650. The substrate layer 601 may be, for example, a silicon (Si) substrate. The penetration electrodes 640 may be disposed in the substrate layer 601 to penetrate the substrate layer 601. Each of the penetration electrodes 640 may be electrically connected to a corresponding one of substrate interconnection lines 630, which will be described below. The first conductive pads 650 may be disposed adjacent to a bottom surface of the substrate layer 601. The first conductive pads 650 may be electrically connected to the penetration electrodes 640. The penetration electrodes 640 and the first conductive pads 650 may be formed of or may include at least one of conductive metal materials (e.g., copper (Cu), aluminum (Al), tungsten (W), or titanium (Ti)).

The interconnection layer 602 may include second conductive pads 610, internal interconnection lines 620, and substrate interconnection lines 630. The second conductive pads 610 may be adjacent to a top surface of the interconnection layer 602, and the substrate interconnection lines 630 may be adjacent to a bottom surface of the interconnection layer 602. The second conductive pads 610 may be exposed to the outside of the interconnection layer 602 near the top surface of the interconnection layer 602. The internal interconnection lines 620 may be electrically connected to the second conductive pads 610 and the substrate interconnection lines 630. The second conductive pads 610, the internal interconnection lines 620, and the substrate interconnection lines 630 may be formed of or may include at least one of conductive metal materials (e.g., copper (Cu), aluminum (Al), tungsten (W), or titanium (Ti)).

The second semiconductor chip 500 may be mounted on the interposer substrate 600. The second semiconductor chip 500 may include the base substrate 510, the first base insulating layer 520, and the second base insulating layer 540. The lower vias 515 may be provided to penetrate the base substrate 510. The interconnection patterns 525 may be provided in the first base insulating layer 520. The first chip pads 560 may be provided in the second base insulating layer 540. The second chip pads 550 may be provided in the first base insulating layer 520.

The first semiconductor chips 100 may be vertically stacked on the second semiconductor chip 500. The first semiconductor chips 100 may include high bandwidth memory (HBM) chips. For example, the first semiconductor chips 100 may include DRAM chips. The first semiconductor chip 100 may include the substrate 110, the first insulating layer 120, the second insulating layer 130, and the third insulating layer 140. The penetration vias 115 may be provided to penetrate the substrate 110. The interconnection structures 125 may be provided in the first insulating layer 120. The lower pads 150 may be provided in the second insulating layer 130. The upper pads 160 may be provided in the third insulating layer 140. The lower and upper pads 150 and 160 may be configured to have the same features as those described with reference to FIGS. 3 to 8. However, the inventive concept is not limited to this example, and in an embodiment, the uppermost one of the first semiconductor chips 100 may not include the penetration vias 115, the third insulating layer 140, and the upper pads 160. The number of the first semiconductor chips 100 stacked is not limited to the example shown in FIG. 16 and may be variously changed.

The third semiconductor chip 300 may be mounted on the interposer substrate 600. The third semiconductor chip 300 may be horizontally spaced apart from the second semiconductor chip 500 and the first semiconductor chips 100. The third semiconductor chip 300 may be a semiconductor chip that is of a different kind from the second semiconductor chip 500 and the first semiconductor chips 100. The third semiconductor chip 300 may include a logic chip, a buffer chip, or a system-on-chip (SOC). For example, the third semiconductor chip 300 may be an application specific integrated circuit (ASIC) chip or application processor (AP) chip. The ASIC chip may include an application specific integrated circuit (ASIC). The third semiconductor chip 300 may include a central processing unit (CPU) or a graphics processing unit (GPU).

The third semiconductor chip 300 may include third chip pads 310 that are adjacent to a bottom surface thereof. The third chip pads 310 may be electrically connected to corresponding ones of the second conductive pads 610 of the interposer substrate 600. The third chip pads 310 may include a conductive metal material. For example, the third chip pads 310 may be formed of or may include at least one of copper (Cu), aluminum (Al), tungsten (W), or titanium (Ti).

The first connection terminals 410 may be interposed between the interposer substrate 600 and the second semiconductor chip 500 and between the interposer substrate 600 and the third semiconductor chip 300. Second connection terminals 420 may be interposed between the package substrate 700 and the interposer substrate 600. The package substrate 700 and the interposer substrate 600 may be electrically connected to each other by the second connection terminals 420. Each of the first conductive pads 650 may be electrically connected to a corresponding one of the substrate pads 710 through a corresponding one of the second connection terminals 420. The second connection terminals 420 may be formed of or may include at least one of solder balls, solder bumps, and solder pillars. The second connection terminals 420 may include a conductive metal material. For example, the second connection terminals 420 may be formed of or may include at least one of tin (Sn), lead (Pb), silver (Ag), zinc (Zn), nickel (Ni), gold (Au), copper (Cu), aluminum (Al), or bismuth (Bi). A pitch of the second connection terminals 420 may be smaller than a pitch of the outer terminals 400.

The first under-fill layer 810 may be interposed between the interposer substrate 600 and the second semiconductor chip 500 and between the interposer substrate 600 and the second semiconductor chip 500. The first under-fill layer 810 may be provided to fill a space between the first connection terminals 410 and to seal or encapsulate the first connection terminals 410.

A second under-fill layer 820 may be interposed between the package substrate 700 and the interposer substrate 600. The second under-fill layer 820 may be provided to fill a space between the second connection terminals 420 and to seal or encapsulate the second connection terminals 420. The second under-fill layer 820 may be formed of or may include an insulating polymer (e.g., an epoxy-based polymer).

The mold layer 800 may be provided on the package substrate 700. The mold layer 800 may cover the top surface of the package substrate 700, top and side surfaces of the third semiconductor chip 300, side surfaces of the second semiconductor chip 500, and top and side surfaces of the first semiconductor chips 100. In an embodiment, the mold layer 800 may be provided to expose the top surface of the uppermost one of the first semiconductor chips 100 and the top surface of the third semiconductor chip 300. However, the inventive concept is not limited to this example, and in an embodiment, the mold layer 800 may cover the top surface of the uppermost one of the first semiconductor chips 100 and the top surface of the third semiconductor chip 300, unlike the illustrated structure.

FIGS. 17, 18, 19, 20, 21, and 22 are sectional views illustrating a method of fabricating a semiconductor package including a semiconductor device according to an example embodiment of the inventive concept. For concise description, a previously described element may be identified by the same reference number without repeating an overlapping description thereof.

Referring to FIG. 17, the substrate 110 may be provided. For example, the substrate 110 may be a wafer-level substrate. However, for consistency in description, top and bottom surfaces will be described based on the structure of FIG. 3.

The penetration vias 115 may be formed in the substrate 110. The penetration vias 115 may be exposed to the outside of the substrate 110 near the bottom surface 110b of the substrate 110. The penetration vias 115 may not be extended to the top surface 110a of the substrate 110. The first insulating layer 120 may be formed on the bottom surface 110b of the substrate 110. The interconnection structure 125 may be formed in the first insulating layer 120.

Referring to FIG. 18, the second insulating layer 130 may be formed on the first insulating layer 120. The second insulating layer 130 may be patterned to form a plurality of first trenches TR1 in the second insulating layer 130. The patterning of the second insulating layer 130 may include performing an exposing process and a developing process. The patterning process may be performed to expose a portion of the first insulating layer 120 and a portion of the interconnection structure 125. In detail, the uppermost ones of the conductive vias 127 may be exposed to the outside by the patterning process. The first trenches TR1 may be formed to have at least two different widths. For example, the first trenches TR1 may include at least two first trenches TR1 having maximum widths different from one another. When viewed in a plan view, as a distance to the center of the substrate 110 decrease, a width of a bottom surface of the first trench TR1 may gradually increase. Each of the first trenches TR1 may have a decreasing width or a tapered shape in a downward direction.

Referring to FIG. 19, the lower pads 150 may be formed to fill the first trenches TR1, respectively. The formation of the lower pads 150 may include forming a conductive layer on the second insulating layer 130 to fill the first trenches TR1 and to cover the second insulating layer 130 and performing a polishing process on the second insulating layer 130. After the polishing process, the bottom surfaces 150b of the lower pads 150 may be located at the same level as a bottom surface 130b of the second insulating layer 130.

The polishing process may include, for example, a chemical mechanical polishing (CMP) process.

Referring to FIG. 20, the substrate 110 may be inverted such that the top surface 110a of the substrate 110 is oriented in an upward direction. A thinning process may be performed on the substrate 110. A portion of the substrate 110 may be removed by the thinning process, and thus, the substrate 110 may be thinned. As a result of the thinning process, the penetration vias 115 may have top surfaces that are exposed to the outside of the substrate 110 near the top surface 110a of the substrate 110. After the thinning process, the top surface 110a of the substrate 110 may be located at the same level as the top surfaces of the penetration vias 115. The thinning process may include, for example, an etching process or a grinding process.

The third insulating layer 140 may be formed on the substrate 110. The third insulating layer 140 may be patterned to form a plurality of second trenches TR2 in the third insulating layer 140. The patterning of the third insulating layer 140 may include performing an exposing process and a developing process. The top surfaces of the penetration vias 115 may be exposed to the outside by the patterning process. The second trenches TR2 may be formed to have at least two different widths. For example, the second trenches TR2 may include at least two second trenches TR2 having maximum widths different from one another. When viewed in a plan view, as a distance to the center of the substrate 110 decreases, a width of a bottom surface of the second trench TR2 may gradually increase. Each of the second trenches TR2 may have a decreasing width or a tapered shape in a downward direction.

Referring to FIG. 21, the upper pads 160 may be formed to fill the second trenches TR2, respectively. The formation of the upper pads 160 may include forming a conductive layer on the third insulating layer 140 to fill the second trenches TR2 and to cover the third insulating layer 140 and performing a polishing process on the third insulating layer 140. After the polishing process, the top surfaces 160a of the upper pads 160 may be located at the same level as the top surface of the third insulating layer 140. The polishing process may include, for example, a chemical mechanical polishing (CMP) process. As a result of the afore-described process, a semiconductor device according to an embodiment of the inventive concept may be fabricated.

According to an embodiment of the inventive concept, since each of the lower and upper pads 150 and 160 has an outwardly increasing width, as the polishing process progresses, the width of each of the upper and lower pads 160 and 150 may decrease. Accordingly, the upper and lower pads 160 and 150 may be prevented from having a dished structure, and the surfaces of the upper and lower pads 160 and 150 may be maintained to a substantially flat shape. As a result, it may be possible to prevent a bonding failure between the upper and lower pads 160 and 150 in a subsequent process of bonding the first semiconductor chips 100, to improve bonding efficiency in the bonding process, and thereby to improve reliability of a semiconductor package.

Referring to FIG. 22, the first semiconductor chip 100 may be placed on the second semiconductor chip 500, and then, a bonding process may be performed to bond the first semiconductor chip 100 to the second semiconductor chip 500. The bonding process may include bringing the first chip pads 560 of the second semiconductor chip 500 in direct contact with the lower pads 150 of the first semiconductor chip 100 and bringing the second base insulating layer 540 of the second semiconductor chip 500 in direct contact with the second insulating layer 130 of the first semiconductor chip 100. In an embodiment, the second semiconductor chip 500 may be a wafer-level substrate. As an example, a dicing process may be performed on the second semiconductor chip 500. In FIG. 22, the second semiconductor chip 500 is illustrated as a single element, for convenience in illustration.

Referring back to FIGS. 1 and 3, at least one additional semiconductor chip (e.g., having the same structure as the first semiconductor chip 100) may be further mounted on the first semiconductor chip 100. A semiconductor package including the semiconductor device may be fabricated through the afore-described process.

According to an embodiment of the inventive concept, as a distance to a center of a substrate decreases, widths of an upper pad and a lower pad may increase. The lower pad may be provided such that a width of a top surface thereof is smaller than a width of a bottom surface thereof, and the upper pad may be provided such that a width of a top surface thereof is larger than a width of a bottom surface thereof. Accordingly, even when a polishing process is performed in a subsequent step, the top surface of the upper pad and the bottom surface of the lower pad may be formed to have a substantially flat shape without a dished portion. As a result, it may be possible to prevent a bonding failure between the upper pad and the lower pad, to improve bonding efficiency in a process of stacking and bonding semiconductor chips, and thereby to improve reliability of a semiconductor package.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate;
a first insulating layer on a bottom surface of the substrate;
an interconnection structure provided in the first insulating layer;
a second insulating layer on a bottom surface of the first insulating layer; and
a plurality of lower pads provided in the second insulating layer,
wherein top surfaces of the plurality of lower pads are coplanar with a top surface of the second insulating layer and bottom surfaces of the plurality of lower pads are coplanar with a bottom surface of the second insulating layer,
wherein each of the plurality of lower pads is provided such that a width of a top surface thereof is smaller than a width of a bottom surface thereof,
wherein an angle between the top surface and a side surface of each of the plurality of lower pads is an obtuse angle and an angle between the bottom surface and the side surface of each of the plurality of lower pads is an acute angle,
wherein a width of each of the plurality of lower pads gradually increases from the top surface thereof to the bottom surface thereof,
wherein the plurality of lower pads comprise a first lower pad, a second lower pad, and a third lower pad,
wherein when viewed in a plan view, the first lower pad is adjacent to a center of the substrate, the third lower pad is adjacent to an edge of the substrate, and the second lower pad is disposed between the first lower pad and the third lower pad, wherein a width of a bottom surface of the first lower pad is larger than a width of a bottom surface of the second lower pad, wherein the width of the bottom surface of the second lower pad is larger than a width of a bottom surface of the third lower pad, wherein the bottom surface of each of the plurality of lower pads is configured to directly contact a top surface of a corresponding upper pad of an adjacent semiconductor chip, and wherein the bottom surface of each of the plurality of lower pads has a width equal to the top surface of the corresponding upper pad of the adjacent semiconductor chip.

2. The semiconductor device of claim 1, wherein each of the plurality of lower pads has one of a triangular shape or a trapezoidal shape, when viewed in a sectional view.

3. The semiconductor device of claim 1, wherein each of the plurality of lower pads has one of a circular shape, a triangular shape, a rectangular shape, or a polygonal shape having five or more sides or corners, when viewed in a plan view.

4. The semiconductor device of claim 1,
wherein, when viewed in a plan view, as a distance to the center of the substrate decreases, the widths of the bottom surfaces of the plurality of lower pads gradually increase, wherein the width of the bottom surface of the first lower pad is 110% to 150% of the width of the bottom surface of the second lower pad, and wherein the width of the bottom surface of the first lower pad is larger than 150% of the width of the bottom surface of the third lower pad and is equal to or smaller than 500% of the width of the bottom surface of the third lower pad.

5. The semiconductor device of claim 1, further comprising:
a third insulating layer on a top surface of the substrate; and
a plurality of upper pads provided in the third insulating layer,
wherein each of the plurality of upper pads is provided such that a width of a top surface thereof is larger than a width of a bottom surface thereof.

6. The semiconductor device of claim 5,
wherein the plurality of upper pads comprise a first upper pad, a second upper pad, and a third upper pad,
wherein when viewed in a plan view, the first upper pad is adjacent to the center of the substrate, the third upper pad is adjacent to the edge of the substrate, and the second upper pad is disposed between the first upper pad and the third upper pad,
wherein a width of a top surface of the first upper pad is larger than a width of a top surface of the second upper pad, and
wherein the width of the top surface of the second upper pad is larger than a width of a top surface of the third upper pad.

7. The semiconductor device of claim 5, further comprising:
penetration vias provided to penetrate the substrate and to be coupled to the interconnection structure,
wherein the plurality of upper pads and the plurality of lower pads are electrically connected to each other by the penetration vias.

8. The semiconductor device of claim 5,
wherein the bottom surface of each of the plurality of lower pads is flat, and
wherein the top surface of each of the plurality of upper pads is flat.

9. The semiconductor device of claim 5, wherein each of the plurality of upper pads has one of a triangular shape or a trapezoidal shape, when viewed in a sectional view.

10. The semiconductor device of claim 5, wherein each of the plurality of upper pads has one of a circular shape, a triangular shape, a rectangular shape, or a polygonal shape having five or more sides or corners, when viewed in a plan view.

11. The semiconductor device of claim 1,
wherein, when viewed in a plan view, a total area of the plurality of lower pads in a first unit region is larger than a total area of the plurality of lower pads in a second unit region,
wherein the first unit region has the same area as the second unit region, and
wherein a width of a top surface of a lower pad of the plurality of lower pads in the first unit region is larger than a width of a top surface of a lower pad of the plurality of lower pads in the second unit region.

12. A semiconductor package, comprising:
a first semiconductor chip; and
a second semiconductor chip on a bottom surface of the first semiconductor chip,
wherein the first semiconductor chip comprises:
a substrate;
a first insulating layer on a bottom surface of the substrate;
an interconnection structure provided in the first insulating layer;
a second insulating layer on a bottom surface of the first insulating layer; and
a plurality of lower pads provided in the second insulating layer,
wherein top surfaces of the plurality of lower pads are coplanar with a top surface of the second insulating layer and bottom surfaces of the plurality of lower pads are coplanar with a bottom surface of the second insulating layer,
wherein an angle between the top surface and a side surface of each of the plurality of lower pads is an obtuse angle and an angle between the bottom surface and the side surface of each of the plurality of lower pads is an acute angle,
wherein a width of each of the plurality of lower pads gradually increases as a distance to a bottom surface thereof decreases,
wherein the plurality of lower pads comprise a first lower pad adjacent to a center of the substrate and a second lower pad adjacent to an edge of the substrate,
wherein a width of a top surface of the first lower pad is larger than a width of a top surface of the second lower pad,
wherein the second semiconductor chip comprises first chip pads which are adjacent to a top surface thereof, each of the first chip pads provided such that a width of a top surface thereof is larger than a width of a bottom surface thereof, and
wherein the top surfaces of the first chip pads directly contact bottom surfaces of the plurality of lower pads.

13. The semiconductor package of claim 12, wherein the first semiconductor chip comprises:

penetration vias penetrating the substrate;
a third insulating layer on a top surface of the substrate; and
a plurality of upper pads provided in the third insulating layer,
wherein the penetration vias are in contact with the plurality of upper pads.

14. The semiconductor package of claim 13,
wherein each of the plurality of upper pads is provided such that a width of a top surface thereof is larger than a width of a bottom surface thereof, and
wherein as a distance to the center of the substrate decreases, the widths of the bottom surfaces of the plurality of upper pads gradually increase, when viewed in a plan view.

15. The semiconductor package of claim 13,
wherein an angle between bottom and side surfaces of each of the plurality of upper pads is an obtuse angle.

16. The semiconductor package of claim 12,
wherein each of the plurality of lower pads comprises a plurality of sub-patterns stacked,
wherein the sub-patterns have different widths from each other, and
wherein as a distance to a bottom surface of the second insulating layer decreases, the widths of the sub-patterns increase.

17. A semiconductor package, comprising:
a package substrate;
a first lower semiconductor chip on the package substrate; and
a first upper semiconductor chip on the first lower semiconductor chip,
wherein each of the first lower and upper semiconductor chips comprises:
  a substrate;
  a first insulating layer on a bottom surface of the substrate;
  an interconnection structure provided in the first insulating layer;
  a second insulating layer on a bottom surface of the first insulating layer; and
  a plurality of lower patterns provided in the second insulating layer,
wherein the first lower semiconductor chip further comprises:
  a third insulating layer on a top surface of the substrate; and
  a plurality of upper patterns provided in the third insulating layer,
wherein the plurality of upper patterns of the first lower semiconductor chip are in direct contact with the plurality of lower patterns of the first upper semiconductor chip,
wherein top surfaces of the plurality of lower patterns are coplanar with a top surface of the second insulating layer and bottom surfaces of the plurality of lower patterns are coplanar with a bottom surface of the second insulating layer,
wherein an angle between the top surface and a side surface of each of the plurality of lower patterns is an obtuse angle and an angle between the bottom surface and the side surface of each of the plurality of lower patterns is an acute angle, and
wherein as a distance to a center of the substrate decreases, widths of top surfaces of the plurality of lower patterns gradually increase, when viewed in a plan view.

18. The semiconductor package of claim 17, wherein the third insulating layer is in direct contact with the second insulating layer of the first upper semiconductor chip.

19. The semiconductor package of claim 17,
wherein each of the plurality of upper patterns is provided such that a width of a top surface thereof is larger than a width of a bottom surface thereof, and
wherein each of the plurality of lower patterns is provided such that a width of a top surface thereof is smaller than a width of a bottom surface thereof.

* * * * *